United States Patent [19]

Iwase

[11] Patent Number: 4,611,305
[45] Date of Patent: Sep. 9, 1986

[54] DIGITAL SIGNAL PROCESSING CIRCUIT
[75] Inventor: Seiichiro Iwase, Sagamihara, Japan
[73] Assignee: Sony Corporation, Tokyo, Japan
[21] Appl. No.: 524,079
[22] Filed: Aug. 17, 1983
[30] Foreign Application Priority Data
 Jul. 18, 1982 [JP] Japan .................. 57-142527
[51] Int. Cl.⁴ .................. G06F 7/38; G06F 7/44
[52] U.S. Cl. .................. 364/736; 364/754; 364/724
[58] Field of Search .................. 364/736, 754–760; 364/724

[56] References Cited
U.S. PATENT DOCUMENTS

| | | | |
|---|---|---|---|
| 3,805,037 | 4/1974 | Ellison | 364/754 |
| 4,344,148 | 8/1982 | Brantingham et al. | 364/724 |
| 4,407,018 | 9/1983 | Kanemasa | 364/736 |
| 4,443,859 | 4/1984 | Wiggins | 364/724 |
| 4,449,194 | 5/1984 | Wilhelm | 364/757 |
| 4,513,388 | 4/1985 | Veendrick et al. | 364/736 |

Primary Examiner—James D. Thomas
Assistant Examiner—Dale M. Shaw
Attorney, Agent, or Firm—Lewis H. Eslinger; Alvin Sinderbrand

[57] ABSTRACT

A digital signal processing circuit formed on a single integrated chip includes a multiplier for multiplying a multiplicand and multiplier signal to produce a multiple bit product signal having higher order bits delayed more than lower order bits; a first delay circuit for concatenating and delaying the multiplier and multiplicand signals to produce a delayed concatenated signal having higher order bits delayed more than lower order bits; a first selector for selectively supplying either the product signal, the delayed concatenated signal, or a concatenated signal formed from the multiplier and multiplicand signals, as a first selected signal; an adder for adding an input signal to the first selected signal to produce a summed signal; a second delay circuit for delaying a summed signal by a predetermined amount to produce a first delayed summand signal; a third delay circuit for delaying the summand signal to produce a second delayed summand signal having higher order bits delayed more than lower order bits; a second selector for selectively supplying either the first or second delayed summand signal to the adder as the input signal; a fourth delay circuit for delaying the summed signal by a predetermined amount to produce a first delayed summed signal; a fifth delay circuit for delaying the summed signal to produce a second delayed summed signal having lower order bits delayed more than higher order bits; and a third selector for selectively supplying either the first or second delayed summed signal as an output of the processing circuit.

42 Claims, 26 Drawing Figures

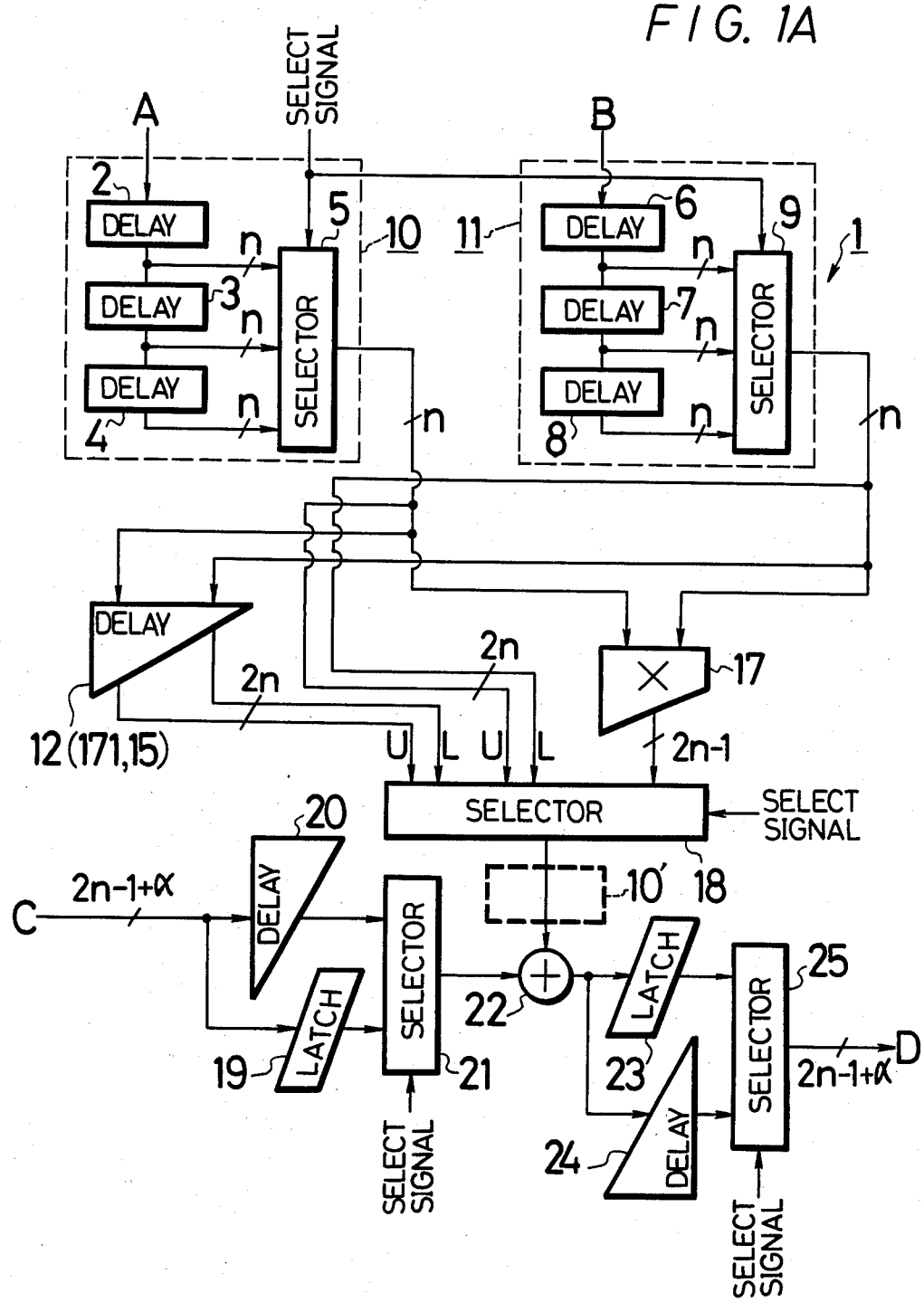

F I G. 2A-a
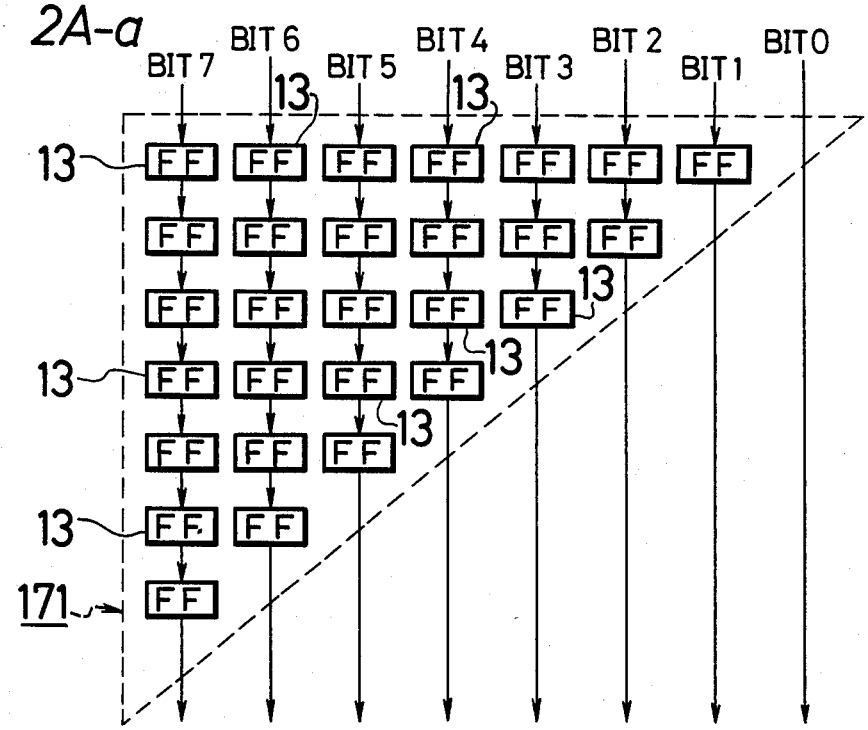
F I G. 2A-b
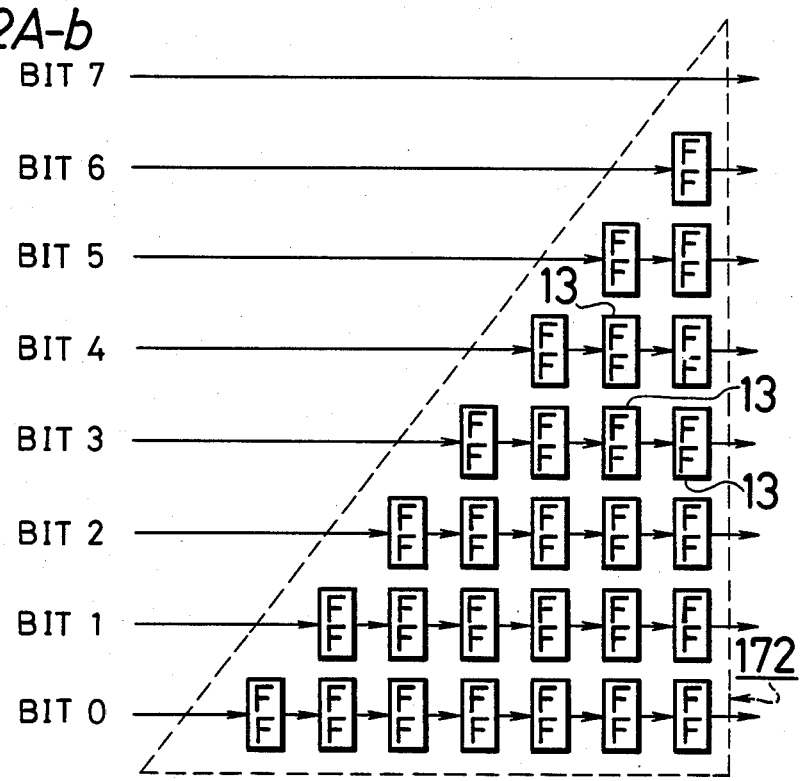

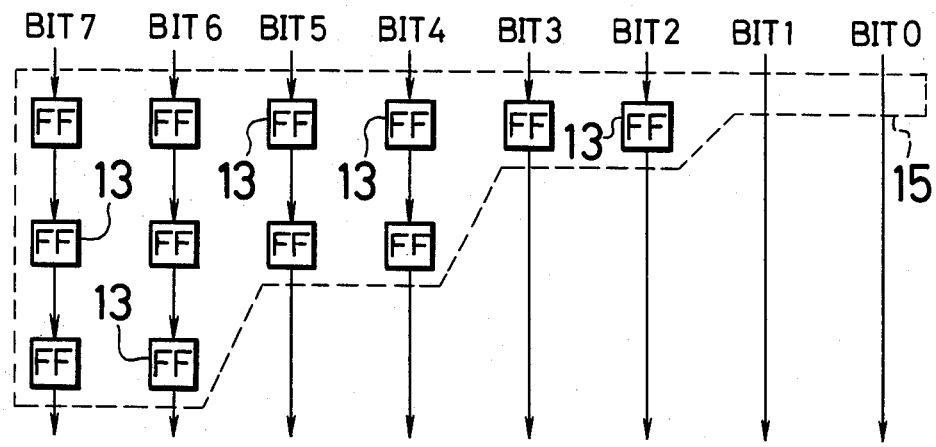
FIG. 2B-a
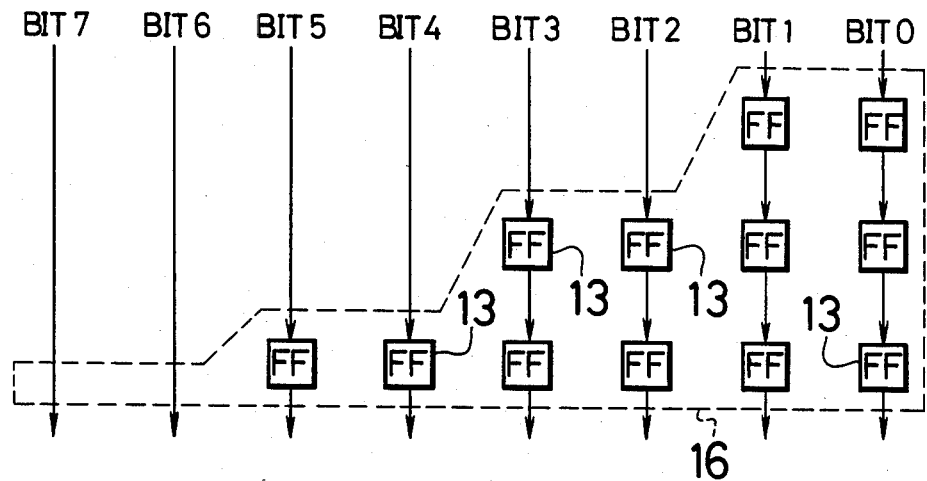
FIG. 2B-b
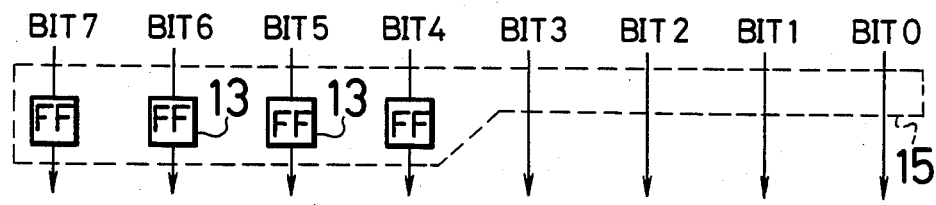
FIG. 2C-a
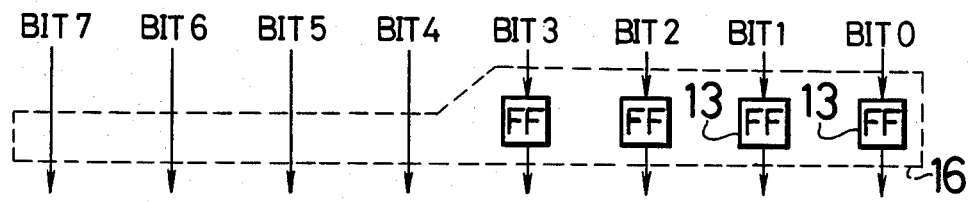
FIG. 2C-b

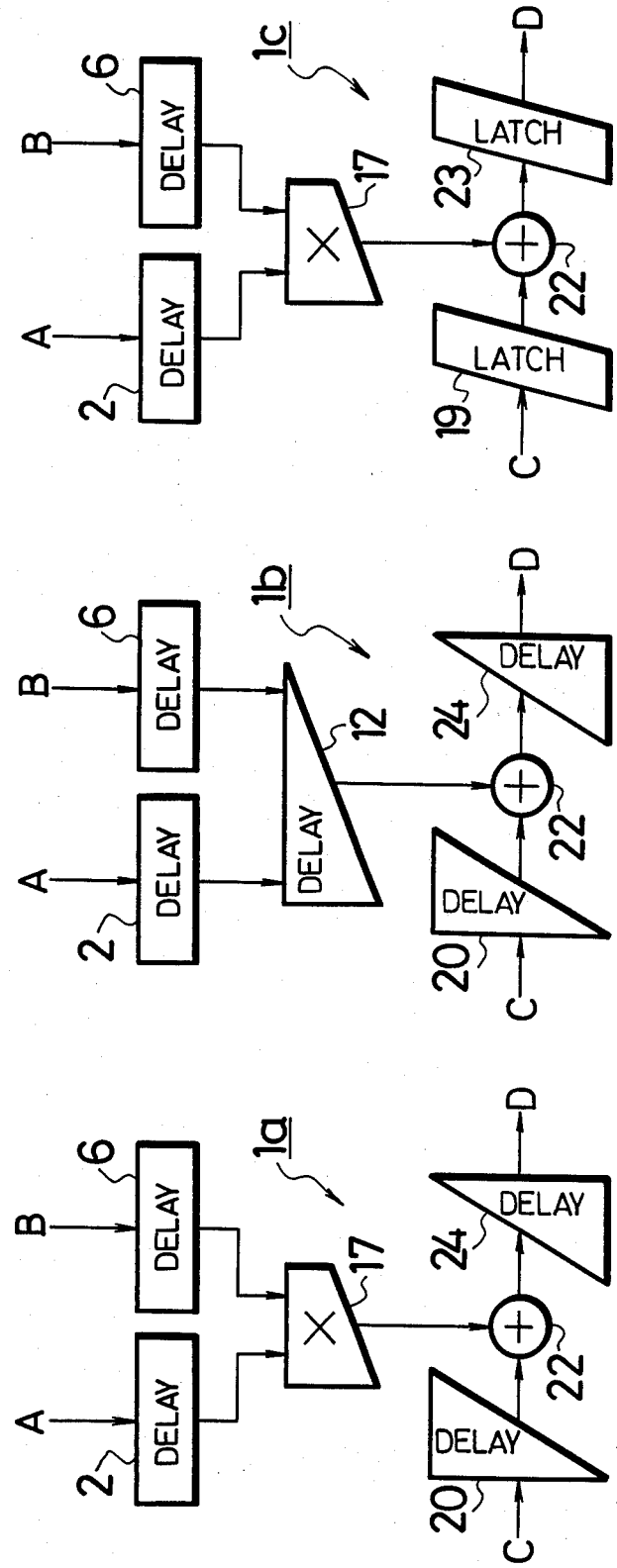

DIGITAL SIGNAL PROCESSING CIRCUIT

CROSS REFERENCES TO RELATED APPLICATIONS

Reference is made to copending application Ser. No. 465,053, filed Feb. 9, 1983 now U.S. Pat. No. 4,527,191 and copending application Ser. No. 506,699, filed June 22, 1983, now U.S. Pat. No. 4,547,796 also assigned to the assignee of the present application.

BACKGROUND OF THE INVENTION

1. Field of the Invention

This invention relates to digital signal processing circuits, and more particularly, to a variable digital signal processing circuit formed on a single chip which can be used either alone or in combination with other such chips to build more complex digital circuits.

2. Description of the Prior Art

Digital electronics equipment such as, for example, digital color video camera, generally employ a number of discrete digital circuits such as digital filters, matrix circuits, encoder circuits, adding circuits, multiplier circuits, and the like to process digital data. Discrete digital circuits, however, in such equipment possess significant disadvantages. The equipment is generally bulky, since a number of circuits are used in the construction. Second, such digital equipment is generally expensive because specialized chips are made just for one particular application. It is to be appreciated that the unit cost is very high for designing and manufacturing a limited number of digital circuits. Thus, a digital apparatus using discrete digital circuits is often expensive.

A frequent operation that occurs in digital circuits is the addition of the bits comprising the data words. The bits must be added together and the summing operation completed within one clock period. For example, in a digital color video camera, the sequential addition of the bits must be performed within one period of a clock pulse which has a frequency four times as high as the frequency of the color subcarrier signal. Accordingly, the adding circuit must employ high speed logic elements such as transistor-transistor logic (TTL), emitter-coupled logic (ECL) or the like. However, these high speed logic elements prevent the adding circuit from being formed as a chip with a high integration value and low power consumption. On the other hand, while complementary metal oxide semiconductor (CMOS) logic elements have a high integration value and low power consumption. On the other hand, while complementary metal oxide semiconductor (CMOS) logic elements have a high integration value and low power comsumption, they are not conventionally used for calculation logic elements because of their low calculating speed.

OBJECTS AND SUMMARY OF THE INVENTION

Accordingly, it is an object of the present invention to provide a variable digital signal processing circuit which can avoid the above-described defects inherent in prior art digital signal processing circuits.

It is another object of the present invention to provide a novel variable digital signal processing circuit which can be used as the basic building block for larger digital circuits such as digital filters, color encoders, matrix circuits, adding circuits, multiplier circuits, and the like in which one or more such digital signal processing circuits are used.

It is yet another object of the present invention to provide a variable digital signal processing circuit which has reduced manufacturing costs.

It is still another object of the present invention to provide a variable digital signal processing circuit which is suitable for use in a digital color video camera.

It is a further object of the present invention to provide a compact, inexpensive variable digital circuit for use in digital signal processing circuits.

It is a yet further object of the present invention to provide a variable digital signal processing circuit from CMOS elements which has a high integration value, low power consumption and high speed calculating ability.

In accordance with the present invention, a circuit for processing multiple bit signals comprises a single integrated circuit chip including multiplier means for multipling two transmitted digital signals to produce a multiple bit product signal wherein the higher order bits are delayed more than the lower order bits, and an adding means for adding a transmitted summand signal to the product signal to produce a multiple bit summed signal.

The above, and other objects, features and advantages of the present invention will be apparent from the following detailed description of illustrative embodiments thereof which is to be read in connection with the accompanying drawings.

BRIEF DESCRIPTION OF THE DRAWINGS

FIG. 1A is a block diagram illustrating an embodiment of a digital signal processing circuit in accordance with the present invention;

FIGS. 2A-a to 2C-b are block diagrams illustrating embodiments of delay circuits that can be used in the circuit of FIG. 1A;

FIGS. 6A to 6I are block diagrams illustrating different functional circuit arrangements of the circuit of FIG. 1A;

DESCRIPTION OF THE PREFERRED EMBODIMENTS

Figure 1B:
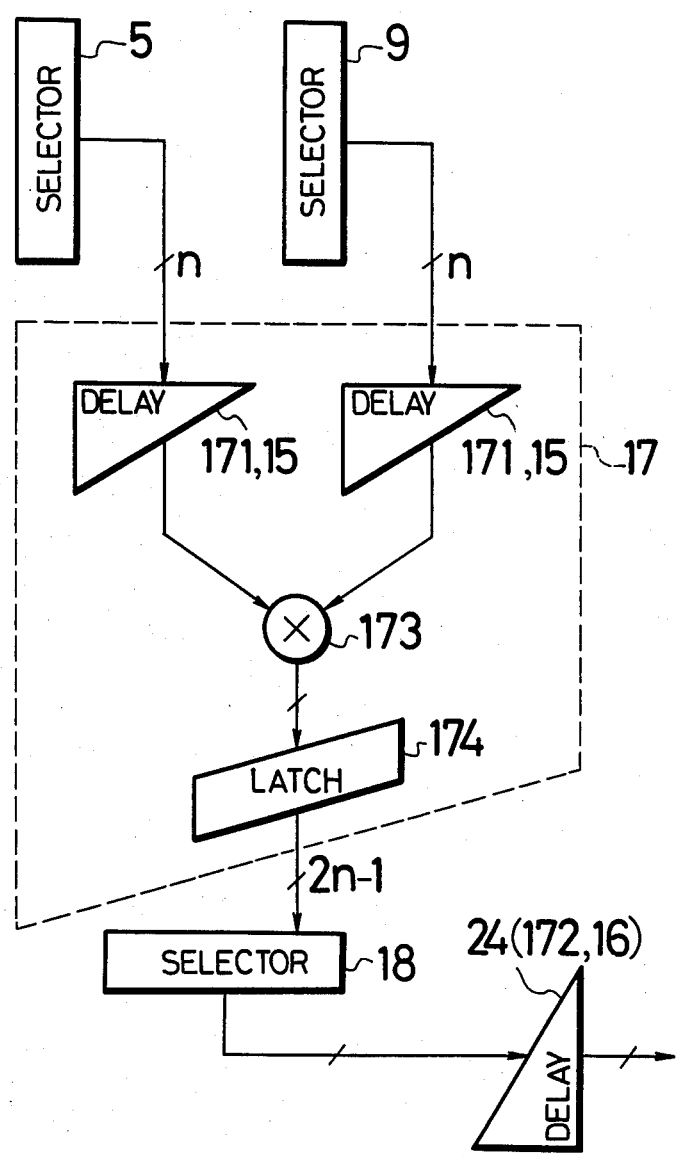
FIG. 1B is a block diagram illustrating an embodiment of a multiplying circuit that can be used in the circuit of FIG. 1A.

Referring to the drawings in detail, and initially to FIG. 1A thereof, a variable digital signal processing circuit 1 according to the present invention includes an input signal stage with delay circuits 2, 3, 4 connected in cascade, in which each delay circuit 2, 3, 4 delays an n bit digital multiplicand signal A by a unit delay. A selector 5 selectively supplies one of the delayed signals from delay circuits 2, 3, 4 in response to a select signal supplied thereto. Delay circuits 6, 7 and 8 are also connected in cascade, and each delays an n bit multiplier signal B by a unit delay. A selector 9 selectively supplies the output signals from delay circuits 6, 7, and 8 in response to the aforesaid select signal. In the illustrated embodiment, delay circuits 2, 3, 4 and selector 5 comprise a variable delay circuit 10, while delay circuits 6, 7, 8 and selector 9 comprise a second variable delay circuit 11. Each variable delay circuit 10, 11 delays the respective bit signals of the multiplicand and multiplier signals A, B by an appropriate amount of delay. As depicted, multiplicand signal A and multiplier signal B can be delayed from 1 to 3 times a unit amount in response to the select signal supplied to selectors 5, 9.

Alternatively, a delay circuit 10', indicated in FIG. 1A by the phantom lines, can be connected between a selector 18 (see FIG. 1C) and an adding circuit 22 (both to be more fully described hereinbelow) to replace variable delay circuits 10, 11.

A delay circuit 12 receives multiplier signal B and multiplicand signal A and concatenates the two signals whereby multiplicand signal A forms the higher order bits U of the concatenated signal and multiplier signal B forms the lower order bits L. Delay circuit 12 delays the resulting signal (of 2n bits) so that the higher order bits are given a progressively larger delay than the lower order bits. In one embodiment of the present invention, delay circuit 12 delays each bit by an incrementally increasing amount (see FIG. 2A-a) so that each bit is delayed by a unit delay amount greater than the next-lower order bit. In an alternate embodiment, delay circuit 12 can delay subdivisions of the bits comprising each digital word, for example, every two bits, as illustrated in FIG. 2B-a, or every four bits, as illustrated in FIG. 2C-a.

A multiplier circuit 17 receives multiplicand signal A and the multiplier signal B and generates a product signal having 2n-1 bits in response thereto. The construction of multiplier circuit 17 will described more fully hereinbelow with reference to FIG. 1B.

Selector 18 receives the product signal A. B from multiplier circuit 17, the concatenated signal from delay circuit 12, and a concatenated signal formed from concatenating multiplicand signal A and multiplier signal B from selectors 5 and 9, and selectively supplies one of the aforesaid signals to adding circuit 22 in response to a select signal, as illustrated in FIG. 1C (wherein n is 4).

Multiplicand signal A and multiplier signal B are supplied to delay circuit 12 where the two signals are concatenated such that the multiplicand signal A forms the higher order bits and multiplier signal B forms the lower order bits, and the higher order bits are than delayed more than the lower order bits. If this latter concatenated signal is selectively supplied to adding circuit 22 by selector 18, multiplier circuit 17 can be bypassed. Accordingly, in such case, variable digital signal processing circuit 1 operates as an adding circuit. Delay circuit 12 thus supplies a signal with the bits having a predetermined delay to adding circuit 22, as described more fully hereinbelow.

If multiplicand signal A and multiplier signal B are supplied directly by selector 18, without passing through delay circuit 12 or multiplier circuit 17, variable digital signal processing circuit 1 again can operate as an adding circuit. In such an instance, when selector 18 selects these latter signals, multiplicand signal A and multiplier signal B have already had the appropriate amount of delay applied to each bit signal by appropriate delay circuits (not shown) prior to digital signal processing circuit 1.

A summand signal C is supplied to an input stage including a latch or delay circuit 19 which delays each of the $2n-1+\alpha$ bits of the digital signal supplied thereto equally by a unit amount. Delay circuit 19 thus operates as a latch. Summand signal C is also supplied to a delay circuit 20 wherein the higher order bits are delayed a larger amount than the lower order bits. In the illustrated embodiment, the bits of the digital summand signal C are divided into subdivisions of, for example, two or four bits, and each subdivision is delayed by respective different unit amounts. Delay circuit 20 is constructed in a similar manner to delay circuit 12, with the primary difference between the two being that the amount of delay imparted by delay circuit 20 is increased by one additional unit delay for each bit, so that delay circuit 20 also performs a latch function on the summand signal. For example, in the preferred embodiment, a flip-flop having one unit delay is provided for the zero bit line in delay circuit 20 and an additional flip-flop is provided for each other line.

Since digital signal processing circuit 1 according to the present invention is connected in series in several stages, as will be described in more detail later, this, summand signal C comprises the bit number of $2n-1+\alpha$, including the word length $\alpha$ of the remainder bit (over-head bit) which is increased by the calculation process from each processing circuit 1. It is to be appreciated that, in the illustrated embodiment, signals of different lengths, such as $2n-1+\alpha$, $2n-1$ and $2n$, are used. The differences in the lengths of the signals are corrected by, for example, selector circuits 18, 21 and 25 and adding circuit 22.

A selector 21 receives the delayed output signals from delay circuits 19, 20 and selectively supplies one of these signals to adding circuit 22 in response to a select signal. Selector 21 thus supplies a summand signal C with a predetermined delay amount when the summand signal is supplied through delay circuit 20. Delay circuit 19 is provided so that adding circuit 22 can deal with the situation where a multiple bit signal supplied to delay circuit 19 has the higher order bits delayed more than the lower order bits.

Adding circuit 22 adds the output signal from selector 18 to summand signal C supplied from selector 21. Adding circuit 22 performs a calculation in which the higher order bits are given a larger delay than the lower order bits and produces a summed output signal D through an output stage. For example, in an eight bit digital word, the eight bits can be divided into four subdivisions having two bits each, in which bits six and seven are delayed more than bits zero and one (see FIG. 5).

A delay circuit or latch 23 receives the summed signal from adding circuit 22, delays each bit thereof by a unit amount, and operates in a fashion similar to the operation of delay circuit 19.

A delay circuit 24 also receives the summed signal from adding circuit 22 and delays the bits comprising the signal such that the lower order bits are given a larger delay than the higher order bits. Delay circuit 24 thus reverses the delay imparted to the bits of the multiplier and the multiplicand signals by multiplier circuit 17 or delay circuit 12. In the preferred embodiment, delay circuit 24 delays the bits comprising the digital signals supplied thereto in subdivisions such as 2 or 4 bits. Accordingly, all the bits corresponding to the original digital signal are supplied in parallel from delay circuit 24. Delay circuit 24 can correspond to delay circuit 16 illustrated in FIG. 5 in which each lower-order bit is delayed by an incrementally greater amount than the next higher-order bit. Delay circuit 24 can also correspond to delay circuits 16 of FIG. 2B-b and FIG. 2C-b with an additional uniform delay stage.

When delay circuit 12 is constructed in accordance with delay circuit 171 of FIG. 2A-a, delay circuit 24 is constructed in accordance with delay circuit 172 of FIG. 2A-b. In a similar fashion, delay circuit 20 is constructed in accordance with delay circuit 171 of FIG. 2A-a. Delay circuit 24 may also include a latch function, if necessary, and is constructed in accordance with delay circuit 172 (see FIG. 1B), with one extra stage delay circuit or flip-flop 13 added for each bit. In other words, one flip-flop is added to all of the bit lines of the delay circuits illustrated with reference to FIGS. 2A-b, 2B-b, and 2C-b, including the zero bit, when delay circuit 24 also has a latch function.

A selector 25 receives the output signals from delay circuits 23, 24 and supplies one of the signals as summed signal D in response to a select signal. When the summed signal is supplied through delay circuit 23 to from adding circuit 22, the higher order bits are given a larger delay amount than the lower order bits in the summed signal D, and the bits may be subdivided into subdivisions having more than one bit. For example, the subdivisions can comprise two bits, as indicated in FIG. 2B-a. The signal path through delay circuit 24, as noted above, corrects for the delays previously supplied to the bits so that the bits in summed signal D have the same amount of delay.

It is to be appreciated that digital signal processing circuit 1 is formed on a single integrated circuit chip. It is to be further appreciated that the functions of digital signal processing circuit 1 can be changed in response to select signals supplied to selectors 5, 9, 18, 21 and 25, as more fully described hereinbelow with reference to FIGS. 6A to 6I.

Figure 1C:
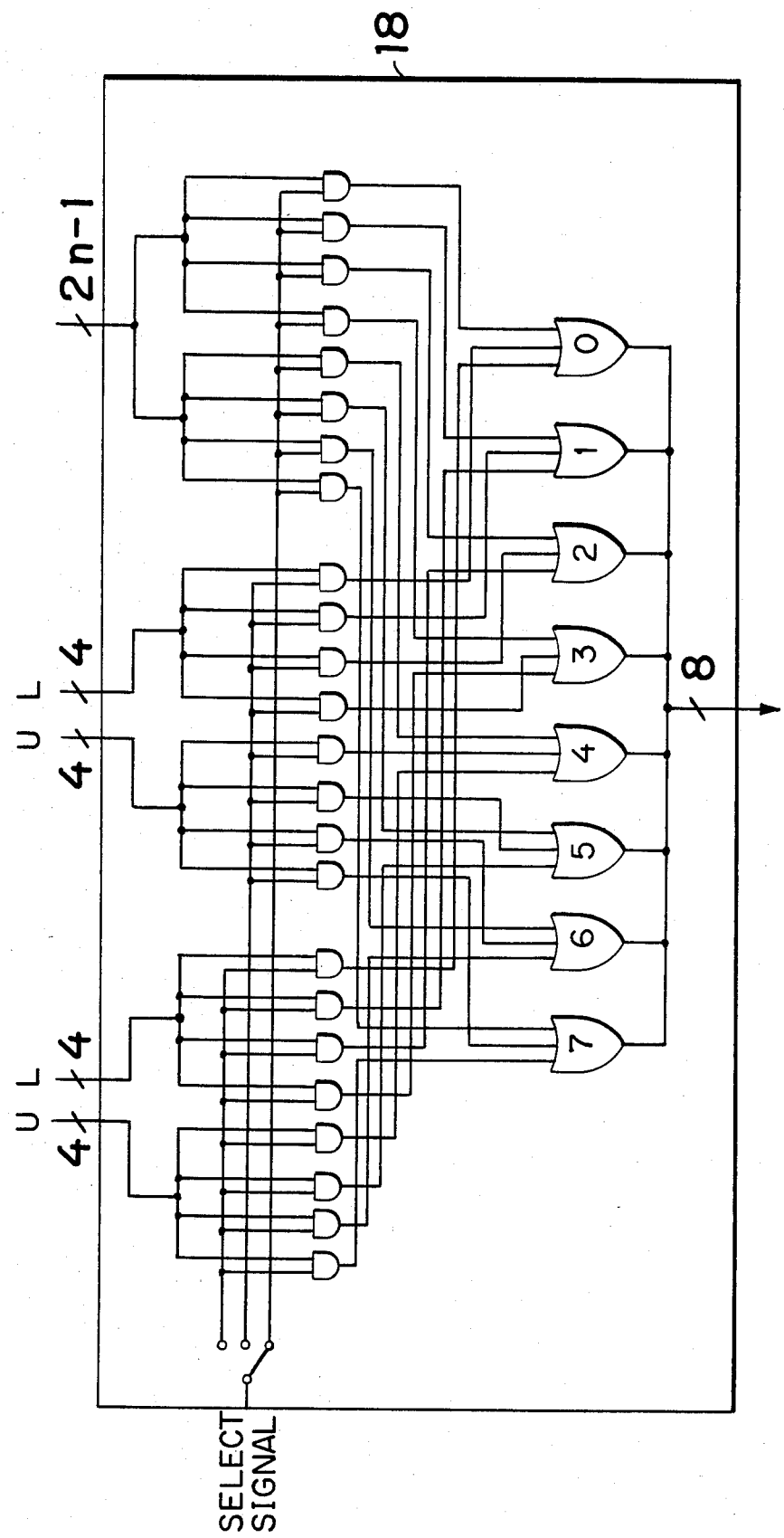
FIG. 1C is a schematic diagram of an embodiment of a selector that can be used in the circuit of FIG. 1A.

FIG. 1B illustrates one configuration of multiplier circuit 17 included in the embodiment of FIG. 1A. (Multiplier circuit 17 is not, of course, limited to the circuit arrangement of FIG. 1B.) Multiplier circuit 17 includes a pair of delay circuits 171 which delay multiplicand signal A and multiplier signal B and supply the delayed signals to a multiplier circuit 173. Multiplier circuit 173 produces a product signal A . B in the order from the lowest order bit to the highest order bit. A delay or latch circuit 174 receives the respective bit signals from product signal A . B and delays the same by a unit delay amount. The delayed output signal from delay or latch circuit 174 is supplied to selector 18, and thereafter, to delay circuit 24, as described hereinbefore. As discussed more fully hereinbelow, the higher order bits of the digital signal are given a larger delay than the lower order bits so that a multiplying section and an adding section can be formed of low-speed logic elements.

Each delay circuit 171 is illustrated in FIG. 2A-a to comprise a plurality of delay elements 13 such as flip-flops. Delay circuit 171 delays the lower order bits less than the higher order bits. For example, bit 0 is not delayed at all, bit 1 is delayed by one unit amount, bit 2 is delayed by 2 unit amounts, and so on, with bit 7 delayed by 7 unit amounts.

FIG. 2A-b illustrates one embodiment of delay circuit 172 (24) which is similar to delay circuit 171. However, delay circuit 172 delays the lower order bits more than the higher order bits. For example, bit 7 is not delayed at all, bit 6 is delayed by a single unit amount, and so on, with bit 0 being delayed by 7 unit amounts.

FIG. 2B-a illustrates an alternate delay circuit 15 which can be used in place of delay circuit 171. In delay circuit 15 of FIG. 2B-a, the bits comprising the digital signal are divided into four subdivisions of two bits each. Bits 0 and 1, comprising one subdivision, are not delayed at all. Bits 2 and 3, comprising a second subdivision, are delayed by one unit amount. Bits 4 and 5, comprising a third subdivision, are delayed by two unit amounts. Bits 6 and 7, comprising a fourth subdivision, are delayed by three unit amounts.

FIG. 2B-b illustrates a delay circuit 16 which can be used in lieu of delay circuits 172 of FIGS. 1B and 2A-b. Delay circuit 16 divides the bits of the digital signal supplied thereto into four subdivisions of 2 bits each, with the higher order bits being delayed less than the lower order bits. In the illustrated embodiment, bits 7 and 6 are not delayed at all, bits 5 and 4 are delayed by a unit amount, bits 3 and 2 are delayed by two unit amounts, and bits 1 and 0 are delayed by three unit amounts. It is to be appreciated that delay circuit 16 reverses or corrects for the delay imparted to the bits by delay circuit 15 of FIG. 2B-a.

FIG. 2C-a illustrates another delay circuit 15 which can be used in lieu of delay circuit 171 of FIGS. 1B and 2A-a. In such delay circuit, the digital input signal is divided into two subdivisions comprising four bits each. Bits 0 to 3 comprise a first subdivision in which the bits are not delayed at all. Bits 4 to 7 form a second subdivision which are delayed by a unit amount.

FIG. 2C-b illustrates another delay circuit 16 corresponding to the delay circuit of FIG. 2A-b in which an 8 bit digital word is divided into 2 subdivisions comprising 4 bits each. Delay circuit 16 of FIG. 2C-b delays bits 0 to 3 by a unit amount, but does not delay bits 4 to 7 at all. It is to be appreciated that delay circuit 16 functions to reverse or correct the delay imparted to a digital signal by delay circuit 15 of FIG. 2C-a.

Delay circuit 12, described hereinbefore, corresponds to delay circuits 171 and 172, with the difference that delay circuit 12 operates on 2n bit signals, while delay circuits 171 in multiplier circuit 17 operate on n-bit signals so that multiplier circuit 17 effectively produces a 2n−1 bit signal. Accordingly, in FIGS. 2B-a and 2C-a the different delay amounts for each bit or subdivision of the bits of the signal is expressed by the slanting of the lines at the input or output sides of the circuit block. More particularly, in the delay circuits of FIGS. 2B-a and 2C-a, delay circuit 12 (see FIG. 1A) receives multiplier signal B as the lower order bits, and multiplicand signal A as the higher order bits. Delay circuit 12 accordingly delays a 2n bit signal (formed by concatenating multiplicand signal A and multiplier signal B) so that the higher order bits are given a larger delay. With reference to FIG. 2B-a, there are four subdivisions of the eight bit signal, and reference numeral 13 indicates a 1 bit flip-flop, so that delay circuit 12 delays the bits comprising the inputted 8 bit signal in increments of 2 bits, whereby the higher order bits are given a larger delay than the lower order bits.

In a digital color video camera, for example, signals having multiple bits are added together. In the addition process, the least significant or lower order bits must be calculated first. As the lower order bits are added, a carry bit is produced. When the carry bit of the least significant or lower order bits is produced, the next adjacent higher order bits are added together. In other words, when two multiple bit digital signals are added together, the lower order digits are added first, followed by the higher order digits. Accordingly, in order to add all of the bits within a predetermined amount of time, such as a single clock pulse, a high speed logic element or circuit must be used in order to prevent the transmission delay time from becoming unduly long. In one digital color video camera, when 8 bit words are added together, the high speed logic element must employ TTL (transistor-transistor logic) and/or ECL (emitter-coupled logic) circuits.

Figure 3:
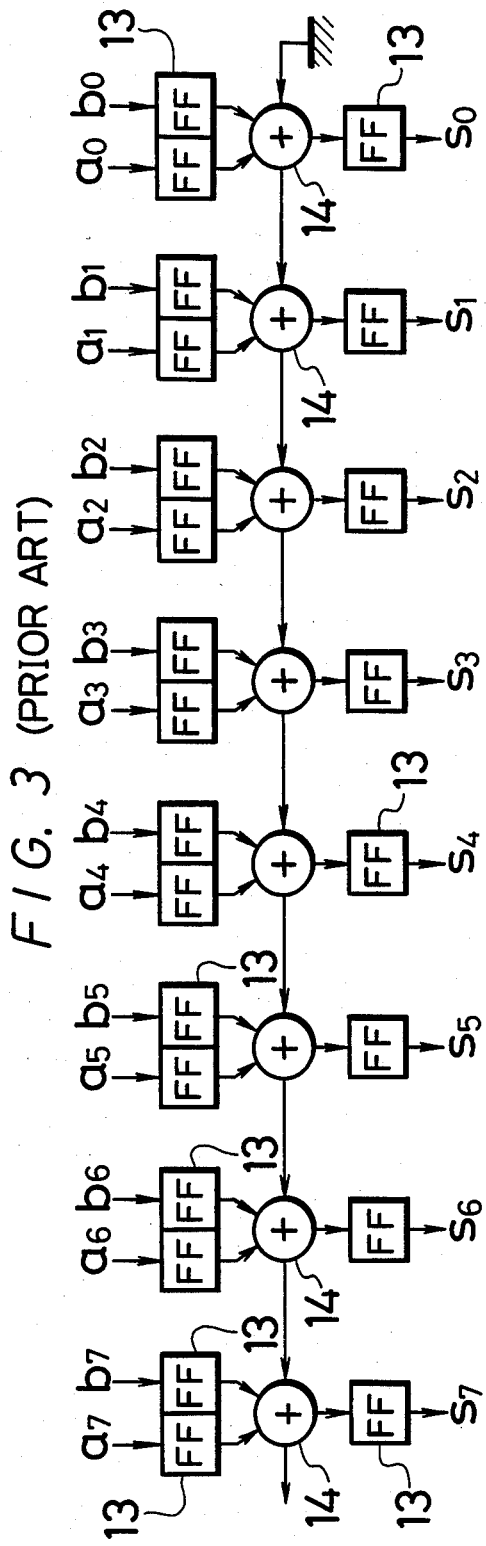
FIG. 3 is a block diagram of a prior art adding circuit.

In the prior art eight bit ripple carry adding circuit of FIG. 3, flip-flops 13 are connected to adding circuits 14 which can be one-bit full adders. In FIG. 3, the two arrows from flip-flops 13 pointing down, towards full-adders 14, represent the adding input signals, while the arrow pointing down from full-adder 14 represents the added output signal. The output signal indicated by the arrow to the left from full-adder 14 indicates the carry output bit which is supplied to the next-higher order bit for inclusion in the sum calculated there. In the circuit of FIG. 3, when a carry look-ahead circuit is employed, all of the bits 0 to 7 can be calculated at high speed. Even though such an expensive carry look-ahead circuit is provided, however, the operational speed of the circuit is limited by the transmission speed of the carry bit from full-adders 14.

In accordance with one embodiment of the present invention, a one-bit flip-flop circuit (not shown) is included in the carry transmission path between full-adders 14 and the subsequent circuit elements. Further delay circuits 171 of FIG. 2A-a are employed to delay the adding inputs so that each bit is delayed more than the next-lower order bit, with the lowest order bit being undelayed. Thus, each bit of the signal can be added at a processing speed of one bit per one period of a clock pulse. It is to be appreciated that bits 0 to 7 of the signal are supplied sequentially, with the lowest order bit 0 supplied first, and the highest order bit 7 supplied last. When the bits 0 to 7 of the signal are supplied to delay circuit 172 of FIG. 2A-b, bit 0 is delayed by 7 unit amounts, bit 1 is delayed by 6 unit amounts, and so on, with bit 7 undelayed. Thus, it is to be appreciated that the output signal from delay circuit 172 will supply simultaneously as output signals all of the bits corresponding to original bits 0 to 7. It is to be noted that the digital data originally generated during a sampling period can be operated on by such a calculating circuit at the slow processing speed of one bit per one period of clock pulse.

However, delay circuits 171 and 172 include a large number of delay elements 13 for both the input and output sides of the calculator, which is undesirable. Twenty-eight delay elements 13 are required in delay circuits 171 and 172 of FIGS. 2A-a and 2A-b, which is a considerable number. An adding circuit employing delay circuits 171 and 172 of FIGS. 2A-a and 2A-b is illustrated in U.S. patent application Ser. No. 465,053, filed Feb. 9, 1983, assigned to the assignee of the present invention, and the disclosure of which is incorporated herein by reference.

Figure 4:
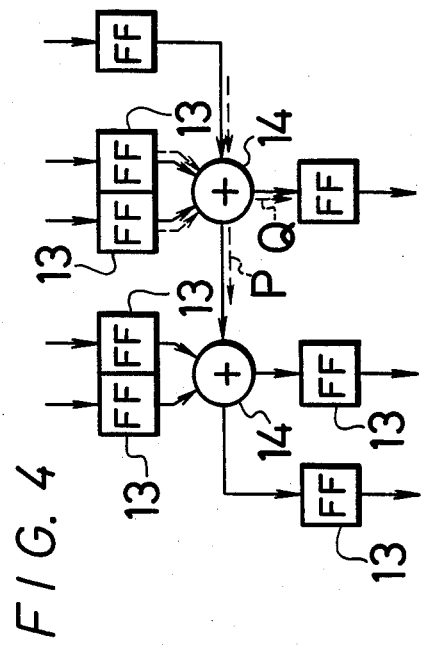
FIG. 4 is a block diagram illustrating an embodiment of a two bit full-adding circuit comprising a calculating circuit that can be used in the digital signal processing circuit of the present invention.
Figure 5:
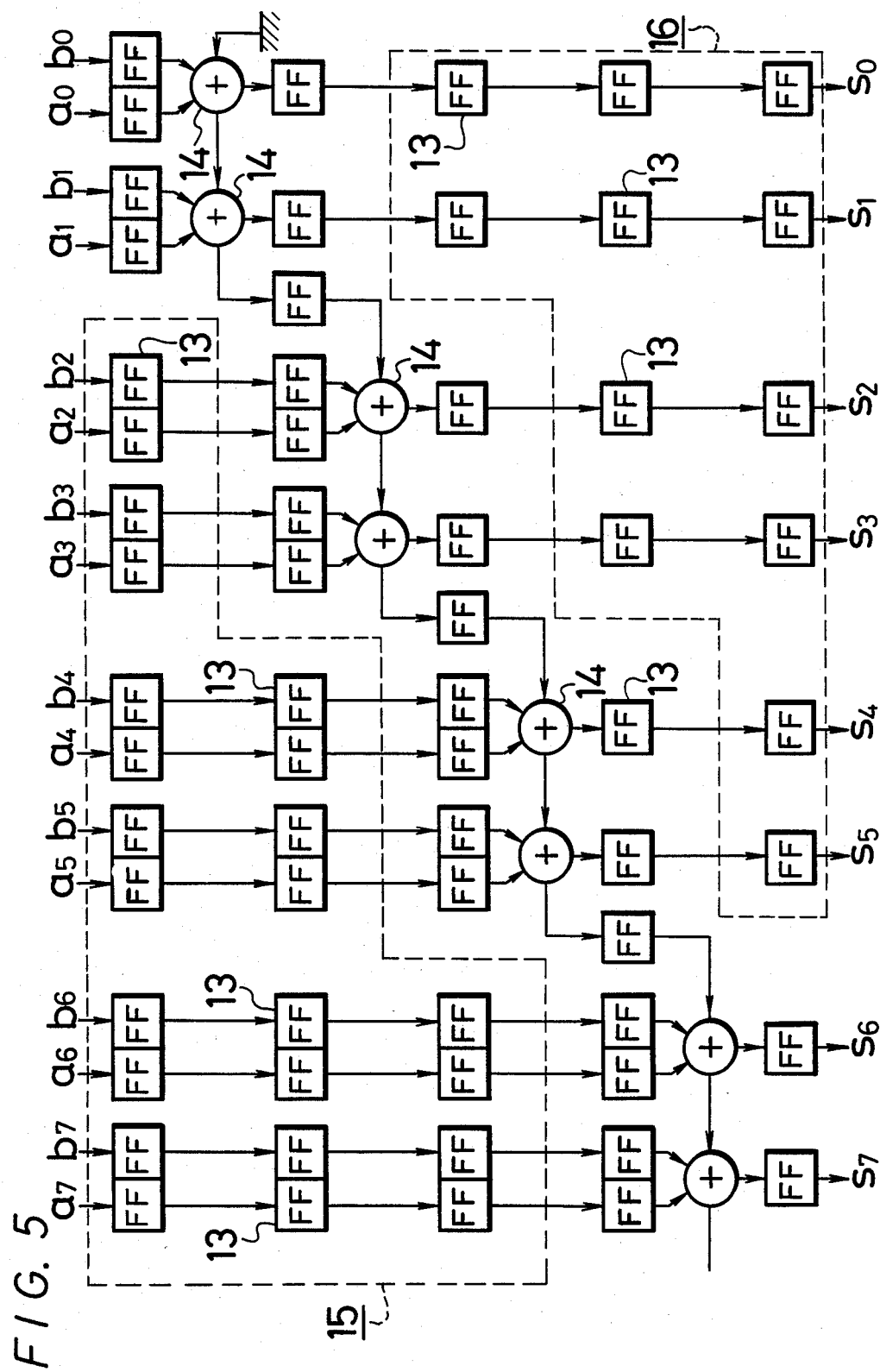
FIG. 5 is block diagram illustrating an embodiment of a calculating circuit with a number of the two bit full-adding circuits of FIG. 4 that can be used in the digital signal processing circuit of the present invention.

Accordingly, in other embodiments of the present invention, a calculating circuit included in the digital signal processing circuit in accordance with the present invention employs a full adder block of multiple bits, for example, two bits, as illustrated in FIG. 4, as a basic construction unit. The calculating circuit using the two bit full-adder blocks is illustrated in FIG. 5. (i.e., the portion not included within the dotted lines indicated by reference numerals 15 and 16) The operational speed of such a calculating circuit is high, almost the same as the speed of the first embodiment, when compared with the conventional calculating circuit of FIG. 3, even though the circuit includes delay circuits 15 and 16 with numerous flip-flops 13.

The number of delay elements, such as flip-flops 13 in delay circuits 15 and 16 according to the present invention can be reduced as compared to the number of delay elements included in the delay circuits of FIGS. 2A-a and 2A-b, when the delay circuits are constructed in accordance with FIGS. 2B-a to 2C-b and FIG. 4. According to the other embodiments of the present invention, a high speed calculating circuit can thus be provided without unnecessarily increasing the number of delay elements in the delay circuits. A person of ordinary skill in the art will appreciate that the other embodiments are not limited to a full adder block with a unit of even numbers of bits, for example, two or four bits. In the 1-bit full adder of FIG. 4, the transmission delay time associated with the carry output (indicated in FIG. 4 by the arrow labeled "P") is short as compared with the transmission delay time necessary for the added result, (indicating by the arrow labeled "Q"). Thus, the delay amounts for the number of bits of the calculator circuit using the delay circuits of FIGS. 2B-a and 2B-b must be selected to be an optimal value so that the predetermined delay times of the two delay circuits are substantially equal to each other. Consequently, the number of latches or delay circuits 13 can be reduced and the calculation speed of the circuit can be very high, in fact, the highest speed for the present invention.

It is to be appreciated that even if the digital signal processing circuit 1 is formed of low speed logic elements such as CMOS elements or the like, and the number of logic elements are increased, the processing speed increases.

It is to be appreciated that, in accordance with the entire discussion above, complementary delay circuits must be used consistently throughout digital signal processing circuit 1. For example, digital signal processing circuit 1 may require either delay circuit 171 or 15 for its input signal so that the higher order bits are delayed more than the lower order bits. That is, when delay circuit 171 in the first embodiment is employed in the multiplier circuit 17, delay circuit 12 (see FIG. 1A) receives multiplier signal B as the lower order bits, and multiplicand signal A as the higher order bits. Delay circuit 12 delays one signal of 2n bits formed by concatenating multiplicand signal A and multiplier signal B whereby the higher order bits are given a larger delay than the lower order bits. Moreover, when delay circuit 15 (see FIG. 5) is included in multiplier 17, the embodiment of delay circuit 15 of FIG. 2B-a is used as the delay circuits in delay circuit 12. Alternatively, delay circuit 15 can be in accord with FIG. 2C-a which delays subdivisions of four bits of the input signal.

In the following description, multiplier circuit 17 includes delay circuit 15 as described in connection with FIGS. 2B-a and 2C-a, and not delay circuit 171 of FIG. 2A-a.

According to another embodiment, multiplier circuit 17 of FIG. 1B multiplies multiplicand signal A and multiplier signal B supplied from selectors 5, 9 respectively, to produce a multiple bit product signal, and may include delay circuits 15 and adding circuits 14 (which may be in accord with the circuit of FIG. 5) as fundamental elements thereof. It is to be appreciated that delay circuit 16 of FIG. 5 can be omitted from multiplier circuit 17 of FIG. 1B, as discussed more fully below. In such case, adding circuit 14 supplies a product signal having 2n-1 bits expressed as a two's complement signed binary number. More specifically, two digital signals from multiplier and multiplicand signals B, A, excluding the most significant bits, comprise n-1 bits, respectively. Accordingly, the product of the signals derived from multiplier and multiplicand signals B, A, identified by A·B, is (n−1)·(n−1), or 2n−2 bits. If a sign bit is added to the left of the most significant bit of the product signal, the final product output signal has 2n−2+1, or 2n−1 bits.

As explained herein, multiplying circuit 17 can generate digital signals in which the bits are divided into 2-bit subdivisions since a number of the adding circuits comprising multiplying section 17 require input digital signals formed with a higher bit having a larger delay than a lower order bit. Thus, delay circuits 15, 16 are not needed for every adding circuit in digital signal processing circuit 1 but may only be required at the input and output stages of multiplying circuit 17. In addition, since another adding circuit (to be described later) is provided at a later stage in digital signal processing circuit 1, delay circuit 16 may not be required in the output stage of multiplier circuit 17. Thus, multiplier circuit 17 generates multiple bit data with the higher order bits delayed more than the lower order bits, in which, for example, the bits are delayed in two bit subdivisions.

FIGS. 6A to 6I illustrate various functional circuits which can be selected from digital signal processing circuit 1 by varying the select signals supplied to selectors 5, 9, 18, 21 and 25. For ease of understanding, reference letters 1a to 1i indicate circuits realized in respective stages or modes of operation of digital signal processing circuit 1.

FIG. 6A illustrates a circuit 1a formed from digital signal processing circuit 1 in which selectors 5, 9 deliver the delayed input signals to multiplier section 17 which produces a product signal supplied to adding circuit 22. Selector 21 supplies the output signal from delay circuit 20 to adding circuit 22. Selector 25 supplies the output signal from delay circuit 24 as summed signal D. Circuit 1a performs the calculation A·B+C. It is to be appreciated that if delay circuit 20 is grounded at its input side, so that summand signal C is zero, circuit 1a operates as a multiplying circuit which performs the multiplication of A·B.

FIG. 6B illustrates an adding circuit 1b formed from digital signal processing circuit 1 in which selectors 5 and 9 deliver the output signals from delay circuits 2 and 6, respectively. Selector 18 supplies the output signal from delay circuit 12 to adding circuit 22. Selector 21 supplies the output signal from delay circuit 20 to adding circuit 22, and selector 25 supplies the output signal from delay circuit 24. Adding circuit 1b adds summand signal C to signal AB wherein the higher order bits are represented by the character "A" and the lower order bits are represented by the character "B". (It is to be noted that the signal AB refers to the concatenation of signal "A" with signal "B", and does not mean the multiplication A×B).

It is to be appreciated that appropriate select signals supplied to selectors 5, 9, 18, 21 and 25 can be used to control the circuit arrangement of digital signal processing circuit 1. In the following description of circuits 1c to 1i, the states of selectors 5, 9, 18, 21 and 25 will not be indicated for the sake of brevity.

FIG. 6C illustrates a multiplier-adder circuit 1c which forms a finite impulse response (FIR) type digital filter.

Figure 6F:
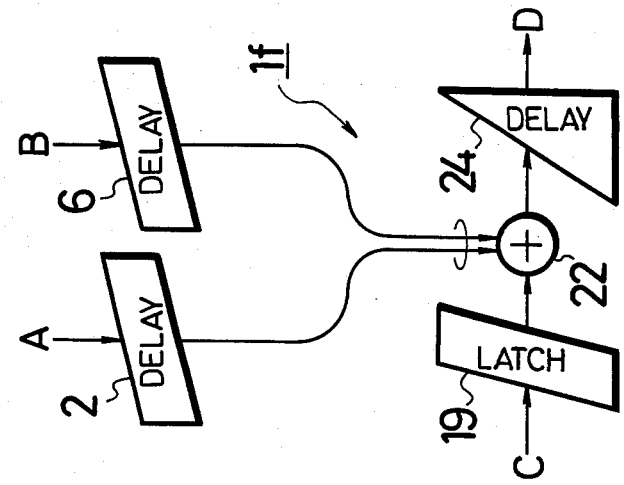
Figure 6E:
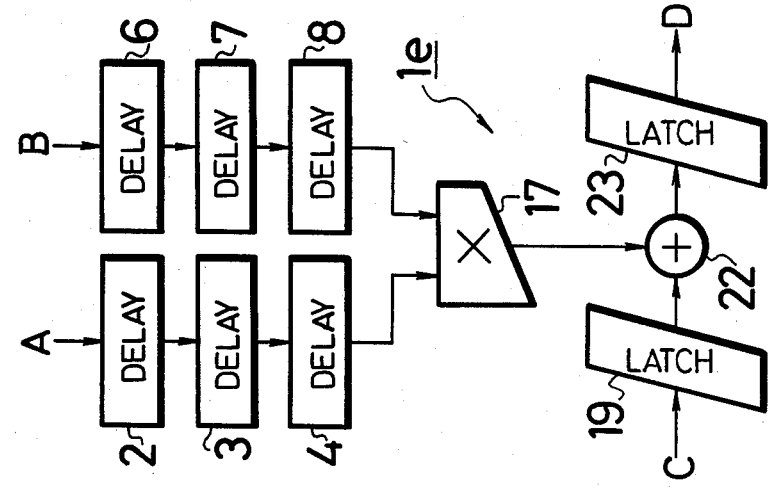
Figure 6D:
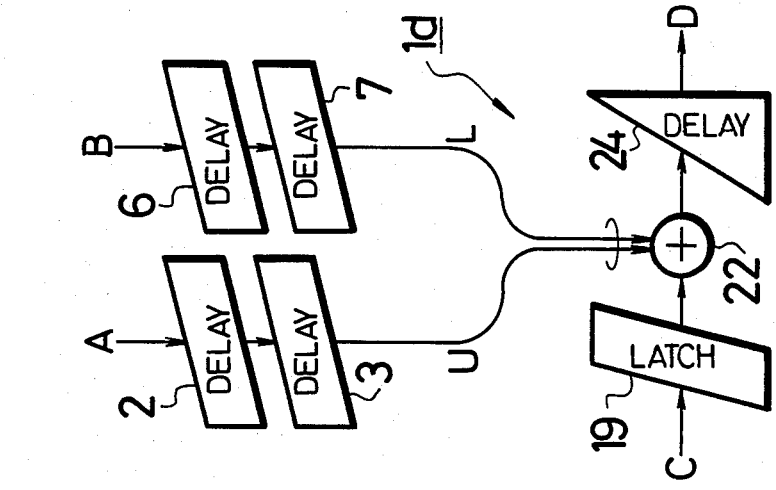

FIG. 6D illustrates an adding circuit 1d for adding two input signals AB, and C.

FIG. 6E illustrates a multiplier-adder circuit 1e in which multiplicand signal A and multiplier signal B are delayed three unit delay amounts, and are then supplied to multiplier circuit 17 where they are multiplied and then supplied to adding circuit 22 to be added to summand signal C.

FIG. 6F illustrates an adding circuit 1f in which multiplicand signal A, comprising the higher order bits, and multiplier signal B, comprising the lower order bits, are concatenated, and then added to summand signal C in adding circuit 22. The summed signal from adding circuit 22 is then supplied to delay circuit 24.

Figure 6G:
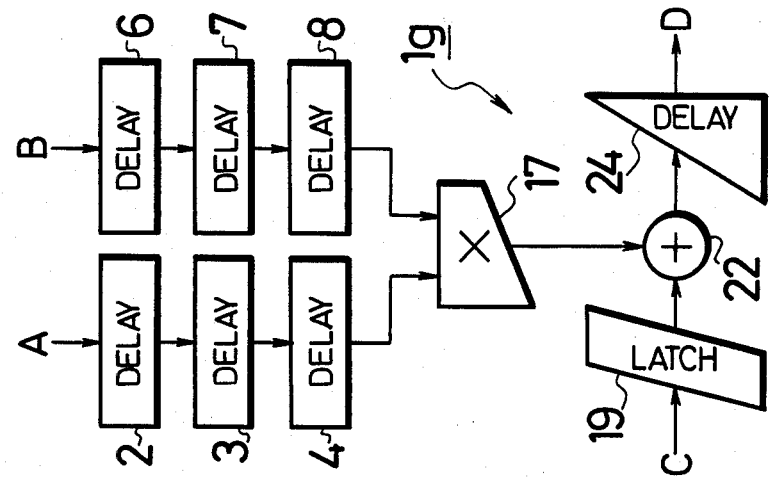

FIG. 6G illustrates a multiplier-adder circuit 1g in which delay circuit 23 of the multiplier-adder circuit 1e of FIG. 6E is replaced with delay circuit 24. Multiplier-adder circuit 1g is suitable for use as the last stage of an inner product circuit which performs an inner product calculation of two-dimensional vectors X and Y.

Figure 6H:
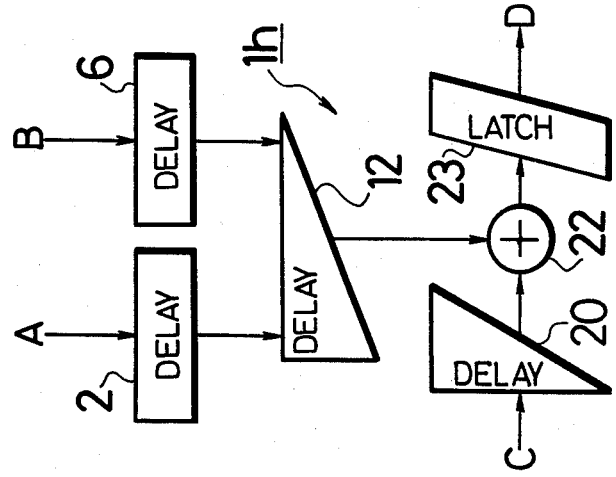

FIG. 6H illustrates an adding circuit 1h used at the input stage of an adder-tree circuit, as will be more fully described hereinbelow.

Figure 6I:
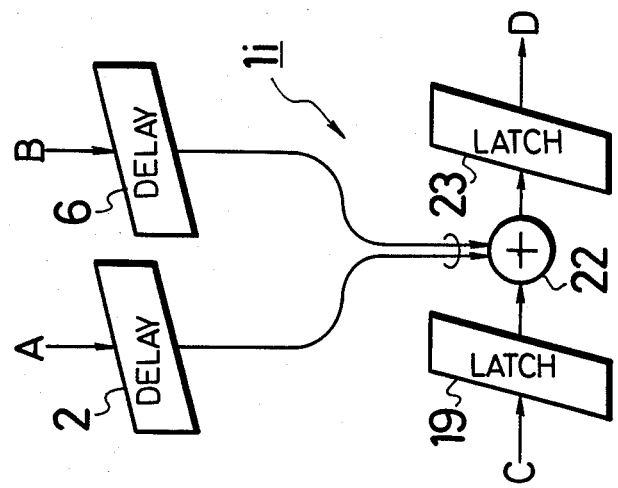

FIG. 6I illustrates an adding circuit 1i used in an intermediate stage of an adder-tree circuit, as described more fully hereinbelow.

It is to be noted that, in accordance with the present invention, a number of digital signal processing circuits 1 can be connected together to form another digital processing circuit wherein each digital processing circuit 1 comprises a basic construction block for the entire circuit.

Figures 7A, 7B:
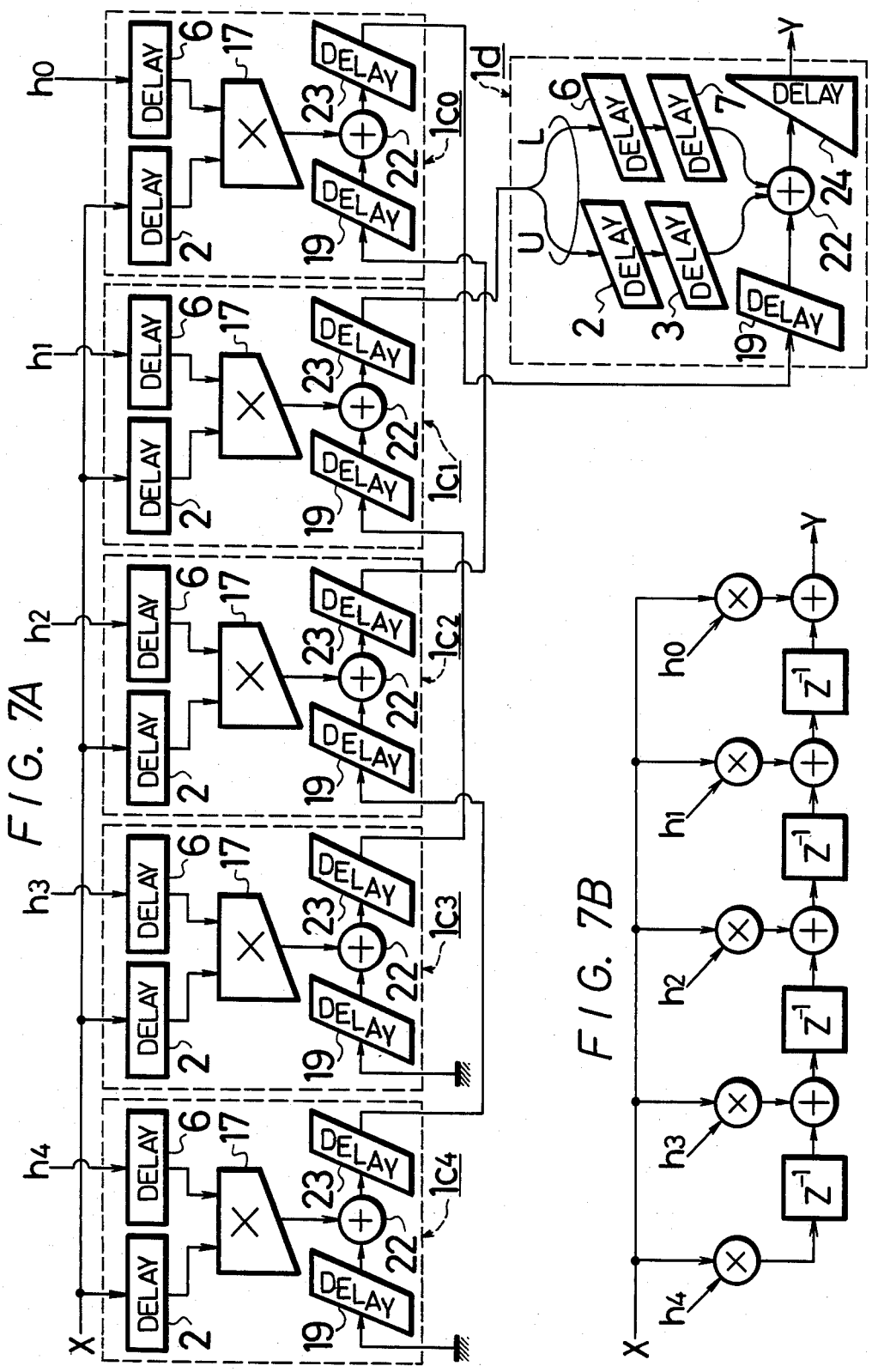
FIG. 7A is a block diagram illustrating a digital filter constructed from a plurality of the circuits of FIG. 1A, in accordance with the present invention.
FIG. 7B is a block diagram illustrating an equivalent circuit of the circuit of FIG. 7A.

FIG. 7A illustrates a 5-tap finite impulse response type digital filter comprising multiplier-adder circuits 1c4, 1c3, 1c2, 1c1 and 1c0, and adding circuit 1d. (FIG. 7B is an equivalent circuit of FIG. 7A). An input signal X is supplied to the five multiplier-adder circuits 1c0, 1c1, 1c2, 1c3, and 1c4 as multiplicand signal A. Constants h4, h3, h2, h1, and h0 are supplied to the five multiplier-adder circuits 1c4, 1c3, 1c2, 1c1, and 1c0, respectively, as multiplier signal B. Delay circuits 19 in multiplier-adder circuits 1c4, 1c3 are also connected to ground so that the summand signals C for each circuit are zero. Accordingly, multiplier-adder circuits 1c4, 1c3 function substantially as multiplying circuits which produce product signals of h4·X and h3·X, respectively.

The summed output signal from multiplier-adder circuit 1c4 is supplied as summand signal C to multiplier-adder circuit 1c2, which also receives constant signal h2. The summed signal D from multiplier-adder circuit 1c2 is supplied to multiplier-adder circuit 1c0 as summand signal C, which circuit also receives constant signal h0. Summed signal D from multiplier-adder circuit 1c3 is supplied to multiplier-adder circuit 1c1 as summand signal C, which also receives constant signal h1. Summed signal D from multiplier-adder circuit 1c0 is supplied to adding circuit 1d (see FIG. 6D) as summand signal C. The summed signal from multiplier-adder circuit 1c1 is supplied to adding circuit 1d as an adding signal. It is to be appreciated that in multiplier-adder circuit 1c1, the higher order bits (indicated by reference letter U) are supplied to delay circuit 2 as if they were multiplicand signal A, while the lower order bits (indicated by the reference letter L) are supplied to delay circuit 6 as multiplier signal B. It is to be further appreciated that multiplier signal B and multiplicand signal A are not multiplied with each other because they are not supplied to multiplier circuit 17.

It is to be noted that the 5-tap finite impulse response type digital filter circuit of FIG. 7A comprises a first circuit including multiplier-adder circuits 1c4, 1c2, 1c0 connected in cascade, and a second circuit including multiplier-adder circuits 1c3 and 1c1 connected in cascade. The output signals from the two circuits are added together in adding circuit 1d. Accordingly, multiplier-adder circuits 1c4, 1c3, 1c2, 1c1, and 1c0 are not all connected in cascade.

An explanation for the connections of FIG. 7A is next to be provided. Adding circuit 22 of each multiplier-adder circuit 1c is provided with a delay circuit 23 for the summed signal D and delay circuit 19 for summand signal C. If all the multiplier-adder circuits 1c4 to 1c0 are connected in cascade, each of the product signals h4·X, h3·X, h2·X, h1·X, and h0·X is delayed by one extra unit amount of delay each time the signal passes through one multiplier-adder circuit 1c, as compared with the finite impulse response-type digital filter of FIG. 7B. Therefore, this extra delay amount must be compensated for so that the appropriate filter characteristic can be obtained. As is clear from the equivalent circuit of FIG. 7B, the summed signal from multiplier-adder circuit 1c1 must be delayed one more unit amount than the summed signal from multiplier-adder circuit 1c0. Accordingly, adding circuit 1d uses delay circuit 19 to delay the output summed signal from multiplier-adder circuit 1c0 by an extra unit amount delay. At the same time, delay circuits 2,3,6 and 7 in adding circuit 1d delay the summed signal from multiplier-adder circuit 1c1 by twice the unit delay amount.

It is to be appreciated that adding circuit 22, which adds two signals together, generates a digital signal having $2n-1+\alpha$ bits in sequential order from the lowest order bit to the highest order bit, where $\alpha$ is a positive integer. Thus, all the bits of a digital signal which was originally sampled at one time can be simultaneously generated if the digital signal is delayed by delay circuit 24 so that the lower order bits are given a larger unit delay amount than the higher order bits to reverse the delay supplied by the other portions of digital signal processing circuit 1.

It is to be noted that an N-tap FIR-type digital filter, frequently used in digital video cameras, can be constructed with $N+1$ digital signal processing circuits 1 in accordance with the arrangement of FIG. 7A, where N is a positive integer. In such an arrangement, N digital signal processing circuits 1 are operated in the mode of multiplier-adder circuit 1c (see FIG. 6C) and the remaining digital signal processing circuit 1 is operated as an adding circuit 1d see FIG. 6D).

Figure 8:
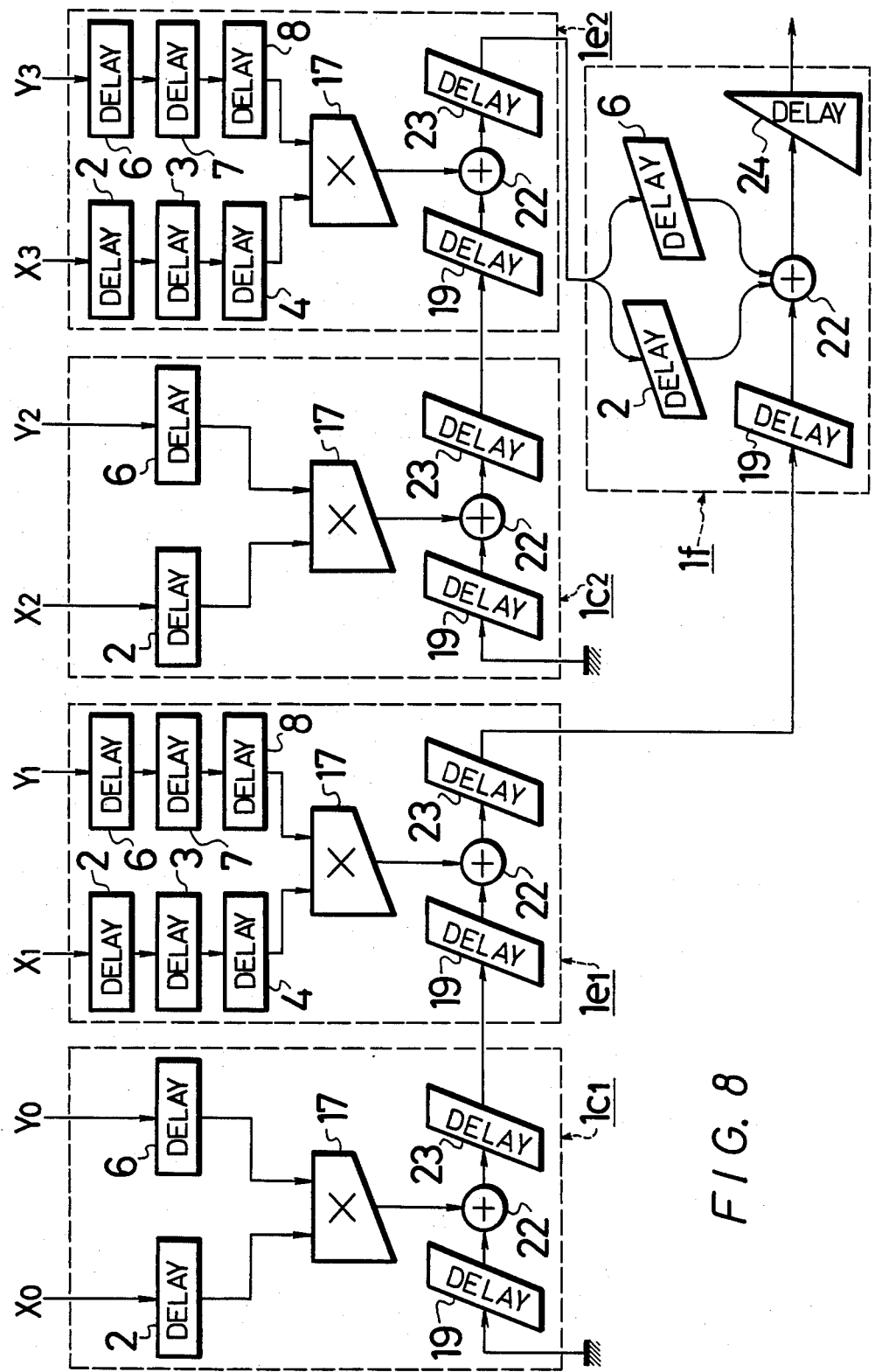
FIG. 8 is a block diagram illustrating an inner product circuit constructed from a plurality of the circuits of FIG. 1A, in accordance with the present invention.

FIG. 8 illustrates a scalar product or inner product circuit formed from multiplier-adder circuits 1c, 1e and adding circuit 1f. The circuit of FIG. 8 includes a multiplier-adder circuit 1c1 for calculating the product of $X_0 \cdot Y_0$, a multiplier-adder circuit 1e1 for calculating the product $X_1 \cdot Y_1$ and adding this product to the output signal $X_0 \cdot Y_0$ from multiplier-adder circuit 1c1, a multiplier-adder circuit 1c2 for calculating the product $X_2 \cdot Y_2$, a multiplier-adder circuit 1e2 for calculating the product $X_3 \cdot Y_3$ and adding the product to output signal $X_2 Y_2$ from multiplier-adder circuit 1c2, and an adding circuit 1f for adding the signal from multiplier-adder circuit 1e1 to the signal from multiplier-adder circuit 1e2. Accordingly, an inner product circuit as illustrated can perform a fourth order inner product calculation of $$X_0 \cdot Y_0 + X_1 \cdot Y_1 + X_2 \cdot y_2 + X_3 \cdot Y_3$$

The inner product calculation is used in a matrix calculation for converting color signals R, G and B to luminance signal Y and chrominance signals I, Q in a digital color video tape recorder or the like. For example, a matrix calculation can be expressed as:

$$\begin{bmatrix} Y \\ I \\ Q \end{bmatrix} = \begin{bmatrix} a_{11} \cdot a_{12} \cdot a_{13} \\ a_{21} \cdot a_{22} \cdot a_{23} \\ a_{31} \cdot a_{32} \cdot a_{33} \end{bmatrix} \begin{bmatrix} R \\ G \\ B \end{bmatrix}$$

The following calculations are performed by the inner product circuit:

$$Y = a_{11} \cdot R + a_{12} \cdot G + a_{13} \cdot B$$

$$I = a_{21} \cdot R + a_{22} \cdot G + a_{23} \cdot B$$

$$Q = a_{31} \cdot R + a_{32} \cdot G + A_{33} \cdot B$$

Thus, an inner product circuit in accordance with FIG. 8 is suitable for calculation of a third order inner product. The respective input terminals of the inner product circuit of FIG. 8 can be made such that $X_0$, $Y_0 = 0$, $Xhd\ 1 = R$, $Y_1 = a_{11}$, $X_2 = G$, $Y_2 = a_{12}$, $X_3 = B$ and $Y_3 = a_{13}$. Accordingly, the inner product circuit can be provided in groups of three systems. In such an inner product circuit, multiplier-adder circuits 1e1 and 1e2, which receives input signals $X_1$, Yhd 1 and $X_3$, $Y_3$, delays (4 total unit delays disregarding the delay amount of multiplier circuit 17 ) vector signals X and Y supplied to multiplier circuit 17 thereof by twice the unit delay amount as compared to multiplier-adder circuits 1c1 and 1c2 (2 total unit delays disregarding the delay amount of multiplier circuit 17) which receive input signals $X_0$, $Y_0$ and $X_2$, $Y_2$. The reason for this is that if the four multiplier-adder circuits are formed of circuit 1c (see FIGS. 6c), the product signals $X_0 \cdot Y_0$ and $X_2 \cdot Y_2$ are delayed twice the unit delay amount as compared to the product signals $X_1 \cdot Y_1$ and $X_3 \cdot Y_3$ by delay circuits 19 and 23 between, for example, multiplier-adder circuits 1c1 and 1e1 and multiplier-adder circuits 1c2 and 1e2.

Figure 9:
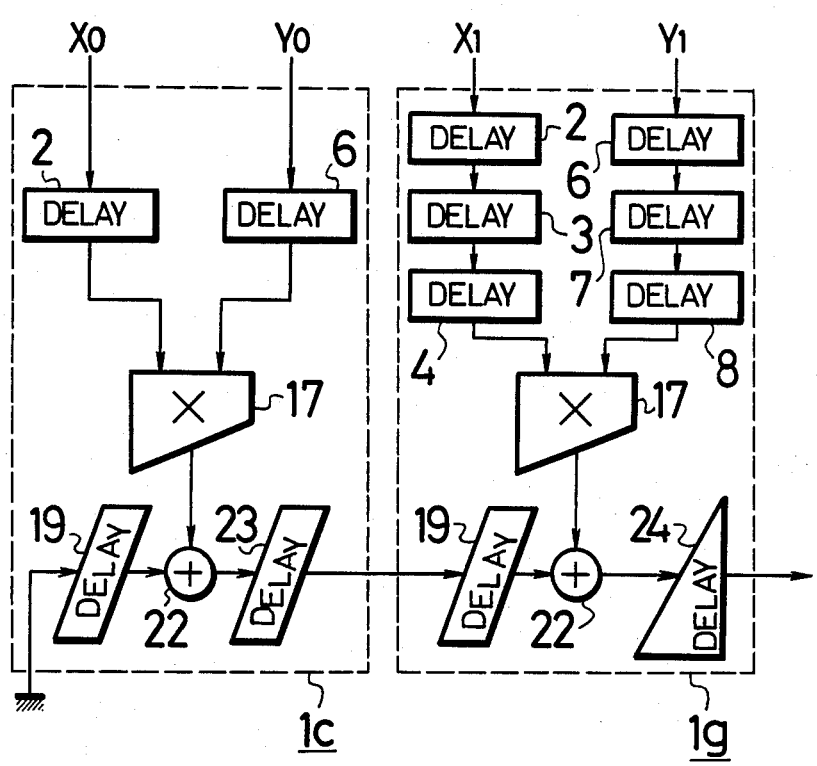
FIG. 9 is a block diagram of another inner product circuit constructed from a plurality of the circuits of FIG. 1A, in accordance with the present invention.

FIG. 9 illustrates an inner product circuit which employs multiplier-adder circuit 1g (see FIG. 6G). According to the inner product circuit of FIG. 9, the output signal $X_0 \cdot Y_0$ from multiplier-adder circuit 1c is supplied to multiplier-adder circuit 1g as summand signal C. The output signal $X_0 \cdot Y_0 + X_1 \cdot Y_1$ therefrom is supplied by delay circuit 24 of multiplier-adder circuit 1g.

If multiplier-adder circuits 1c and 1g are employed as described in FIG. 9, only two digital signal processing circuits 1 are required for the inner product circuit to calculate the inner product of two-dimensional vectors X and Y. Such a two dimensional inner product circuit is useful, for example, as a color difference signal orthogonal modulating circuit or as a keying (cross-fade) multiplying circuit in a chrominance-key circuit included in a video camera or the like.

Figure 10:
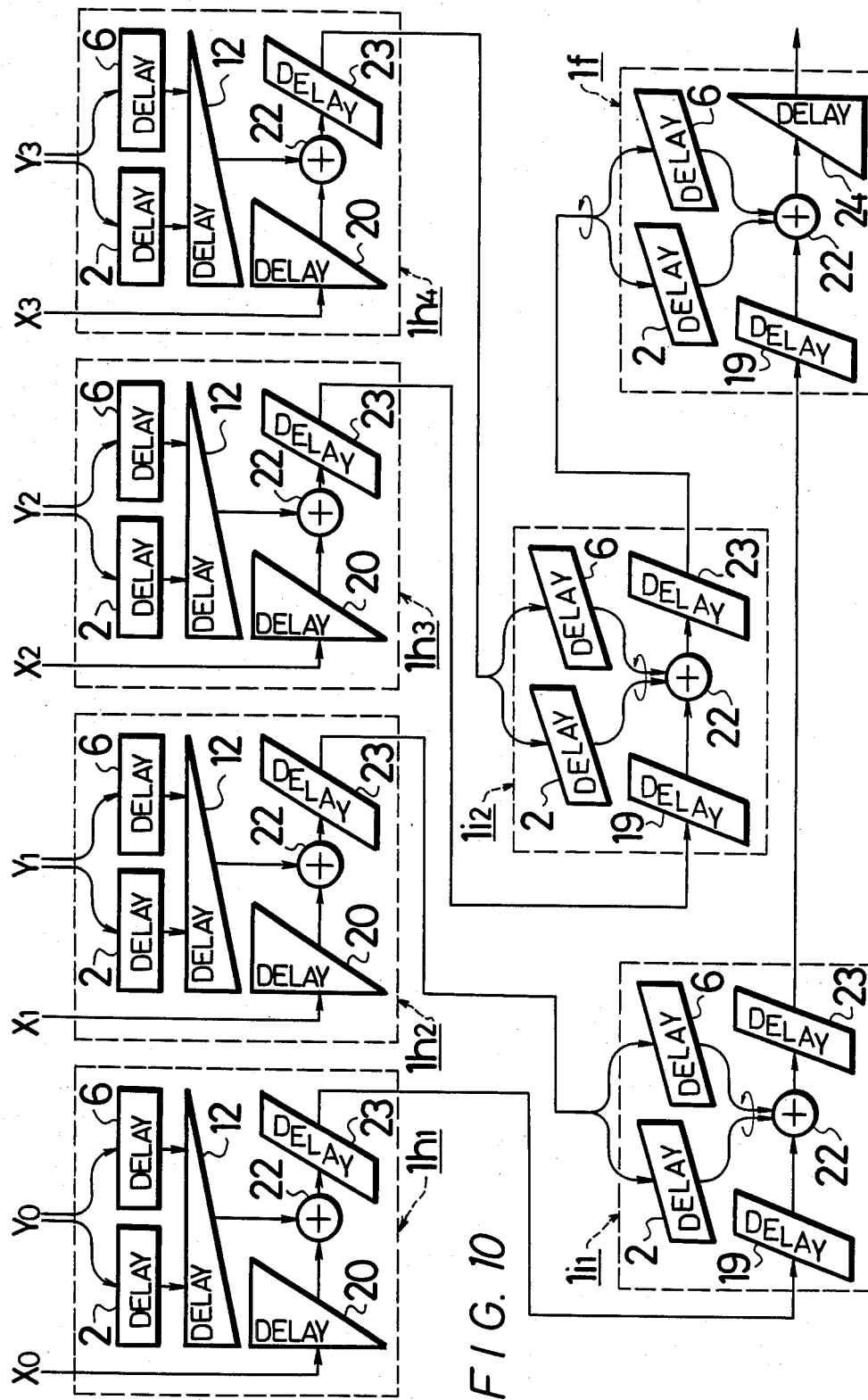
FIG. 10 is a block diagram of an adder tree circuit constructed from a plurality of the circuits of FIG. 1A, in accordance with the present invention.

FIG. 10 illustrates an adder-tree circuit employing adding circuit 1h (see FIG. 6H), adding circuit 1i (see FIG. 6I), and adding circuit 1f. In the adder-tree circuit of FIG. 10, four adding circuits 1h1, 1h2, 1h3, 1h4 are used as the first input stages for adding the corresponding signals $X_0$ to $X_3$ and $Y_0$ to $Y_3$ together. An adding circuit 1i1 adds the output signals from adding circuits 1h1 and 1h2, that is, output signals $X_0 + Y_0$ and $X_1 + Y_1$. Adding circuit 1i2 adds the output signals from adding circuits 1h3 and 1h4, that is, output signals $X_2 + Y_2$ and $X_3 + Y_3$ at the intermediate stage. Adding circuit 1f functions as the third or output stage of the adder-tree circuit and adds the output signals from adding circuits 1i1 and 1i2, namely, output signals $X_0 + Y_0 + X_1 + Y_1$ and $X_2 + Y_2 + X_3 + Y_3$.

As described above, when selectors 5, 9, 18, 21 and 25 in the digital signal processing circuit 1 of FIG. 1A are controlled selectively to supply the signals therethrough, the functions of digital signal processing circuit 1 change as shown in FIGS. 6A to 6I. Thus, a digital circuit such as a digital filter, color encoder, matrix circuit, adding circuit, and multiplier circuit can be constructed by one or more digital signal processing circuits 1.

A person of ordinary skill in the art will recognize that FIG. 1A illustrates only one embodiment of the present invention. Circuits 1a to 1i in FIGS. 6A to 6I are examples which can be realized by controlling the selectors included in the digital signal processing circuit 1. Multiplicand signal A and multiplier signal B, supplied to variable delay circuits 10, 11 of FIG. 1A, pass through selector 18 and adding circuit 22. A single variable delay circuit 10' having an appropriate amount of delay can be connected between selector 18 and adding circuit 22 instead of the variable delay circuits 10 and 11, and the same function of the circuit is realized. The various subcircuits included in digital signal processing circuit 1 can be appropriately changed in response to different numbers of bits calculated thereby.

The digital signal processing circuit 1 of the present invention can be operated in various modes. FIG. 1A illustrates a typical mode of operation of the present invention in which the digital signal processing circuit is formed of a single integrated circuit chip and comprises a multiplier circuit for multiplying signals to produce a multiple bit product signal wherein the higher order bits are given a larger amount of delay than the lower order bits, and an adding circuit which adds the product signal from the multiplier circuit to a multiple bit summand signal.

According to a second mode of operation of the present invention, a digital signal processing circuit is formed on a single integrated circuit chip and includes a multiplier circuit which multiplies two multiple bit signals with each other to produce a multiple bit product signal wherein the higher order bits are given a larger delay than the lower order bits, an adding circuit which adds the multiple bit product signal from the multiplier circuit to a multiple bit summand signal to produce a summed signal, and a summed signal delay circuit which delays each bit of the summed signal from the adding circuit by a unit delay amount.

According to a third mode of operation of the present invention, a digital signal processing circuit is formed on a single integrated circuit chip and includes a multiplier circuit which multiplies multiple bit signals with each other to produce a multiple bit product signal wherein the higher order bits are given a larger delay than the lower order bits, a summand signal delay circuit which delays each bit of a multiple bit summand signal by a unit delay amount, an adding circuit which adds the product signal to the summand signal, and a summed signal delay circuit which delays each bit of a summed signal from the adding circuit by a unit delay amount.

According to a fourth mode of operation of the present invention, a digital signal processing circuit is formed on a single integrated circuit chip and includes a multiplier circuit which multiplies two multiple bit signals with each other to produce a multiple bit product signal in which the higher order bits are given a larger delay than the lower order bits, with each higher order bit being delayed by any incremental amount greater than the next lower order bit, an adding circuit which adds the multiple product signal from the multiplier circuit to a multiple bit summand signal to produce a summed signal, a first summed signal delay circuit which delays the summed signal from the adding circuit such that the lower order bits are delayed more than the higher order bits, with the bits being divided into multiple bit subdivisions in which each subdivision of the bits is given a uniform amount of delay to cancel the differences in the amounts of delay between the respective bits of the summed signal, a second summed signal delay circuit which delays each bit from the adding circuit by a predetermined equal amount, and a selector which receives the output signals of the two summed signal delay circuits and supplies one of them as an output signal.

According to a fifth mode of operation of the present invention, a digital signal processing circuit is formed on a single integrated circuit chip and includes a multiplier circuit which multiplies two multiple bit signals with each other to produce a multiple bit product signal wherein the higher order bits are given a larger delay than the lower order bits, a selector which outputs either a signal formed by concatenating the two digital signals to be multiplied, or the product signal from the multiplier circuit, and an adding circuit which adds the output signal from the selector to a multiple bit summand signal.

According to a sixth mode of operation of the present invention, a digital signal processing circuit is formed of a single integrated circuit chip and includes a multiplier circuit which multiplies two multiple bit signals with each other to produce a multiple bit product signal in which each higher order bit is delayed a unit amount greater than the next lower order bit, a delay circuit which receives the signal formed of the lower order bits corresponding to a multiplicand signal or a multiplier signal supplied to the multiplying section and the higher order bits corresponding to the other signal and delaying the received signal so that the higher order bits are given a larger delay than the lower order bits, wherein the bits are divided into subdivisions with the bits in each subdivision being delayed by the same amount, a selector which receives the same signal supplied to the delay circuit, the output signal from the delay circuit, and the product signal from the multiplier circuit, and supplies one of those signals in response to a select signal, and an adding circuit which adds the output signal from the selector to a multiple bit summand signal.

According to a seventh mode of operation of the present invention, a digital signal processing circuit is formed on a single integrated circuit chip and includes a multiplier circuit which multiplies a multiplicand signal and a multiplier signal with each other to produce a product signal in which each higher order bit is delayed by a unit amount greater than the next lower order bit, a variable delay circuit which delays by a predetermined amount either the multiplicand signal and the multiplier signal supplied to the multiplying circuit or the output signal from the multiplier circuit, a summand signal delay circuit which delays each bit of a multiple bit summand signal by a unit amount, an adding circuit which adds the product signal from the multiplier circuit to the summand signal from the summand signal delay circuit, and a summed signal delay circuit which delays each bit of the summed signal from the adding circuit by a predetermined amount.

It is to be noted that, when a digital signal processing circuit is constructed in accordance with the present invention, an apparatus incorporating a number of such digital signal processing circuits can be manufactured at a low cost.

It is to be further noted that the processing speed of such a digital signal processing circuit can be high since the multiple bit signals used therein can have multiple bit delayed subdivisions wherein the higher order bits are delayed more than the lower order bits, and each subdivision is generated at each unit delay. In addition, such a digital signal processing circuit can have a reduced number of delay elements as compared to a digital signal processing circuit in which each of the bits is delayed by a incrementally increasing amount.

Although specific embodiments of the present invention have been described in detail herein with reference to the accompanying drawings, it is to be understood that the invention is not limited to those precise embodiments, and that various changes and modifications may be effected therein by one skilled in the art without departing from the spirit and scope of the invention as defined in the appended claims

What is claimed is:

1. A circuit for processing multiple bit digital signals comprising a single integrated circuit chip including multiplier means for multiplying two transmitted digital signals to produce a multiple bit product signal having more significant bits thereof delayed more than less significant bits thereof, adding means for adding a summand signal to said product signal to produce a multiple bit summed signal, and means for delaying said summed signal to produce a delayed summed signal, in which said means for delaying includes first delay means for equally delaying each bit of said summed signal to produce a multiple bit first delayed summed signal, second delay means for delaying said summed signal to produce a multiple bit second delayed summed signal having less significant bits thereof delayed more than more significant bits thereof, and selector means for supplying one of said first and second delayed summed signals as an output signal of said circuit for processing.

2. The circuit of claim 1; in which said multiplier means delays each of said bits of said produce signal by a preset amount greater than the next less significant bit thereof, and said second delay means delays each of said bits of said summed signal by said preset amount greater than the next more significant bit thereof.

3. The circuit of claim 1; in which said multiplier means delays subdivisions of said bits of said product signal by a preset amount greater than the mext less significant subdivision of said bits, with said subdivisions of said product signal including at least two bits, and said second delay means delays subdivisions of said bits of said summed signal by said preset amount greater than the next more significant subdivision of said bits, with said subdivons of said summed signal including the same number of bits as said subdivisions of said product signal.

4. The circuit of claim 3; in which said multiplier means and said second delay means delay four bits for each of said subdivisions.

5. The circuit of claim 1; in which said chip further includes delay means for delaying said summand signal to produce a delayed summand signal supplied to said adding means.

6. The circuit of claim 5; in which said delay means for delaying said summand signal includes third delay means for equally delaying each bit of said summand signal to produce a multiple bit first delayed summand signal, fourth delay means for delaying said summand signal to produce a multiple bit second delayed summand signal having more significant bits thereof delayed more than less significant bits thereof, and second selector means for supplying one of said first and second delayed summand signals to said adding means.

7. The circuit of claim 6; in which said fourth delay means delays subdivisions of said bits of said summand signal by a preset amount greater than the next less significant subdivision of said bits, with each of said subdivisions of said summand signal including at least two bits.

8. The circuit of claim 7, in which said second delay means delays four bits as said subdivisions of said bits.

9. The circuit of claim 1; in which said chip further includes variable delay means for delaying by a variable, predetermined amount said product signal.

10. The circuit of claim 1; in which said chip further includes variable delay means for delaying said two transmitted digital signals by a variable, predetermined amount and supplying the delayed signals to said multiplier means.

11. The circuit of claim 10; in which said variable delay means includes third and fourth delay means each for delaying one of said two transmitted digital signals.

12. The circuit of claim 11; in which each of said third and fourth delay means includes a plurality of delay elements connected in series to each other, and selector means connected to each of said respective delay elements, such that said two transmitted digital signals are delayed by a variable, predetermined amount.

13. The circuit of claim 12; in which said chip further includes fifth delay means for delaying said summand signal before being supplied to said adding means; and said multiplier means inludes seventh and eighth delay means for delaying said two transmitted sigital signals after being delayed by said third and fourth delay means such that more significant bits thereof are delayed more than less significant bits thereof.

14. The circuit of claim 1; in which said chip further includes third delay means for concatenating said two transmitted digital signals to produce a concatenated signal and for delaying said concatenated signal to produce a delayed signal having more significant bits thereof delayed more than less significant bits thereof; fourth delay means for delaying said summand signal to produce a multiple bit first delayed summand signal having more significant bits thereof delayed more than less significant bits thereof; fifth delay means for equally delaying each bit of said summand signal by a predetermined amount to produce a second delayed summand signal; and second selector means for selectively supplying one of said first and second delayed summand signals to said adding means.

15. The circuit of claim 1; in which said chip further includes third delay means for concatenating said two transmitted digital signals to produce a concatenated signal and for delaying said concatenated signal to produce a delayed signal having more significant bits thereof delayed more than less significant bits thereof; and selector means for selectively supplying one of said delayed signal and said product signal to said adding means.

16. The circuit of claim 1; in which said multiplier means includes third delay means for delaying each of said bits of said product signal by an incremental amount greater than the next less significant bit thereof.

17. The circuit of claim 16, in which said incremental amount is one time unit.

18. The circuit of claim 1; in which said multiplier means includes third delay means for delaying subdivision of said bits of said product signal by an incremental amount, with said subdivisions of said bits including at least two bits.

19. The circuit of claim 18; in which said subdivisions of said bits include only two bits.

20. The circuit of claim 18; in which said subdivisions of said bits include four bits.

21. The circuit of claim 1; in which said multiplier means includes a multiplier circuit and third delay means for delaying each of said two transmitted digital signals before being supplied to said multipler circuit, with the more significant bits of each signal being delayed more than the less significant bits; and fourth delay means for delaying said summand signal by a predetermined amount before being supplied to said adding means.

22. The circuit of claim 1; in which said chip further includes third delay means for concatenating said two transmitted digital signals and delaying the bits thereof so that the more significant bits are delayed more than the less significant bits to produce a delayed concatenated signal, and second selector means for supplying one of said product signal, said delayed concatenated signal, and a concatenated signal formed from concatenating said two transmitted digital signals, to said adding means.

23. The circuit of claim 22; in which said chip further includes variable delay means for delaying said product signal by a variable, predetermined amount before being supplied to said adding means.

24. The circuit of claim 1; in which said chip further includes selector means for supplying one of said product signal and said transmitted digital signals to said adding means.

25. The circuit of claim 1; in which said chip further includes summand signal delay means for receiving said summand signal and for supplying a delayed summand signal to said adding means.

26. The circuit of claim 1; in which said chip further includes third and fourth delay means connected to said multiplier means for respectively delaying said first and second transmitted digital signals to produce multipler and multiplicand signals having each more significant bit thereof delayed by a predetermined time unit amount more than each less significant bit thereof, fifth delay means for receiving said two transmitted digital signals and producing a delayed signal having each bit thereof delayed by two predetermined time unit amounts, second selector means for supplying one of said product signal and said delayed signal, summand delay means for supplying to said adding means a delayed summand signal having each bit thereof delayed by said predetermined time unit amount, sixth delay means for producing a first delayed summed signal from said summed signal and having each bit delayed by said predetermined time unit amount, fifth delay means for delaying the less significant bits of said summed signal more than the more significant bits to produce a second delayed summed signal, and third selector means for supplying one of said first and second delayed summed signals.

27. A digital circuit for processing digital signals comprising:
a single integrated circuit chip including:
multiplier means for multiplying a multiplicand signal and a multiplier signal to produce a multiple bit product signal having more significant bits thereof delayed more than less significant bits thereof;
first delay means for concatenating said multiplier and multiplicand signals and delaying the concatenated signal to produce a delayed concatenated signal having more significant bits thereof delayed more than less significant bits thereof;
first selector means for selectively supplying one of said product signal, said delayed concatenated signals, and a concatenated signal formed from concatenating said multiplier and multiplicand signals, as a first selected signal;
adding means for adding an input signal to said first selected signal to produce a summed signal;
second delay means for delaying a summand signal by a predetermined amount to produce a first delayed summand signal;
third delay means for delaying said summand signal to produce a second delayed summand signal having more significant bits thereof delayed more than less significant bits thereof;
second selector means for selectively supplying one of said first and second delayed summand signals to said adding means as said input signal;
fourth delay means for delaying said summed signal by a predetermined amount to produce a first delayed summed signal;
fifth delay means for delaying said summed signal to produce a second delayed summed signal having less significant bits thereof delayed more than more significant bits thereof; and
third selector means for selectively supplying one of said first and second delayed summed signals as an output of said digital circuit.

28. The circuit of claim 27; in which said chip further includes variable delay means for delaying said multiplier and multiplicand signals by a variable, predetermined amount.

29. The circuit of claim 27, in which said variable delay means includes multiplier delay means for delaying said multiplier signal to produce a delayed multiplier signal and multiplicand delay means for delaying said multiplicand signal to produce a delayed multiplicand signal.

30. The circuit of claim 29; in which each of said multiplier and multiplicand delay means includes a plurality of delay circuits coupled in series to each other; and selector means for selectively supplying one of said delayed multiplier and multiplicand signals from each of said respective delay circuits, to said multiplier means.

31. The circuit of claim 27; in which said chip further includes variable delay means for delaying said first selected signal by a variable, predetermined amount to produce a delayed selected signal and supplying said delayed selected signal to said adding means.

32. A circuit for processing multiple bit digital signals comprising a plurality of interconnected integrated circuit chips, at least one of said chips receiving a summand signal from at least another of said chips and at least one of said chips supplying a summed signal to at least another of said chips, each of said chips including multiplier means for multiplying two input digital signals to produce a multiple bit product signal having more significant bits thereof delayed more than less significant bits thereof, and adding means for adding a summand signal to said product signal to produce a summed signal.

33. The circuit of claim 32; in which said circuit for processing includes a plurality of consecutively connected multiplier-adder circuit chips, each receiving a first digital signal as a first input signal and a second digital signal as a second input signal, said first and second input signals being multiplied together by said multiplier means thereof to produce a summed signal, the summed signal of a first chip being supplied as the summand signal of a third chip, the summed signal of a second chip being supplied as said summand signal of a fourth chip; and said circuit for processing further icnluding an adding circuit chip for adding the summed signal of said fourth chip to the summed signal of said third chip.

34. The circuit of claim 33; in which each of said multiplier-adder circuit chips include first delay means for delaying said first and second input signals thereto before being supplied to said respective multipler means, second delay means for delaying said summed signal thereof, third delay means for delaying said summand signal thereof before being supplied to said respective adding means; and said adding circuit chip includes fourth delay means for delaying said summed signals from said fourth and third chips, and fifth delay means for delaying said summed signal of said adding circuit chip such that less significant bits thereof are delayed less than more significant bits thereof.

35. The circuit of claim 32; in which said circuit for processing includes at least two pairs of multiplier-adder circuit chips, each pair of chips including a first chip for multiplying first and second input digital signals to produce a first multiplied signal, and a second chip for multiplying third and fourth input digital signals to produce a second multiplied signal and for adding said first multiplied signal to said second multiplied signal to produce a summed signal; said circuit for processing further including an adding circuit chip for adding said summed signals from said second chips of said at least two pairs.

36. The circuit of claim 35, in which each of said first chips includes first delay means for delaying said input digital signals by a first predetermined amount before being supplied to said respective multiplier means, and second delay means for delaying said summed signal from each of said first chips; each of said second chips includes third delay means for delaying said input digital signals by a second predetermined amount before being supplied to said respective multiplier means, fourth delay means for delaying said summed signal from each of said second chips, and fifth delay means for delaying said summand signal from each of said second chips before being supplied to said adding means; and said adding circuit chip includes sixth delay means for delaying said summed signals from said second chips.

37. The circuit of claim 36; in which said first predetermined amount of delay differs from said second predetermined amount of delay.

38. The circuit of claim 32; in which said circuit for processing further includes a first chip for multiplying first and second input digital signals to produce a first summed signal, said first chip including first delay means for delaying said first and second input digital signals before being supplied to said multiplier means, and second delay means for delaying said summed signal from said adding means thereof to produce said first summed signal; and a second chip for multiplying third and fourth input digital signals to produce a product signal and adding said product signal to said first summed signal supplied to said second chip as said summand signal of said second chip, said second chip including third delay means for delaying said third and fourth input digital signals before being supplied to said multiplier means, fourth delay means for delaying said summand signal before being supplied to said adding means, and fifth delay means for delaying said summed signal from said adding means such that more significant bits of said summed signal are delayed less than less significant bits thereof.

39. The circuit of claim 32; in which said circuit for processing includes at least four first stage adding chips, each chip including at least four first stage adding chips, each chip including adding means for adding two input digital signals to produce a first stage summed signal, and each chip including first delay means for delaying said input digital signals before being supplied to said adding means such that more significant bits thereto are delayed more than less significant bits thereto; further including at least two second stage adding chips, each for adding two of said first stage summed signals to produce a second stage summed signal; and further including at least one third stage adding chip for adding said second stage summed signals to produce a third stage summed signal, said third stage adding chip including delay means for delaying said third stage summed signal such that less significant bits thereof are delayed more than more significant bits thereof.

40. The circuit of claim 39; in which each of said first stage adding chips includes delay means for delaying said first stage summed signals; each of said second stage adding chips includes first delay means for delaying said first stage summed signals, and second delay means for delaying said second stage summed signal;

and said third stage adding chip includes delay means for delaying said second stage summed signals.

41. The circuit of claim 32; wherein each of said integrated circuit chips icludes selector means for selectively supplying one of said product signal, and a concatenated signal formed from concatenating said two input digital signals, to said adding means.

42. A digital filter for processing multiple bit digital signals comprising a plurality of interconnected integrated circuit chips, each of said chips including multiplying means for multiplying two multiple bit digital signals together to produce a multiple bit product signal having more significant bits thereof delayed more than less significant bits thereof, summand delay means for delaying a multiple bit summand signal to produce a multiple bit delayed summand signal having each bit thereof delayed by a predetermined amount, adding means for adding said product signal to said delayed summand signal to produce a multiple bit summed signal, summed delay means for delaying each bit of said summed signal by said predetermined amount to produce a delayed summed signal; said chips being arranged in an odd-numbered chip cascade and an even-numbered chip cascade; the delayed summed signal of each of said chips being supplied as the summand signal to the next adjacent chip in the corresponding cascade; summing means for adding the delayed summed signal from the last chip in each of said cascades to produce a multiple-bit output signal; and delay means for delaying the more significant bits of said output signals more than the less significant bits thereof.

* * * * *